United States Patent
Hembree et al.

(10) Patent No.: US 6,562,545 B1
(45) Date of Patent: May 13, 2003

(54) METHOD OF MAKING A SOCKET ASSEMBLY FOR USE WITH A SOLDER BALL

(75) Inventors: David R. Hembree, Boise, ID (US); Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/398,575

(22) Filed: Sep. 17, 1999

(51) Int. Cl.[7] ................................................. G03F 7/00
(52) U.S. Cl. ....................... 430/313; 430/314; 430/312; 430/315; 430/318; 430/270.1; 257/179
(58) Field of Search ................................. 430/313, 315, 430/314, 318, 270.1; 257/179

(56) References Cited

U.S. PATENT DOCUMENTS

| | | | |
|---|---|---|---|
| 4,882,245 A | | 11/1989 | Gelorme et al. ............... 430/14 |
| 4,950,173 A | | 8/1990 | Minemura et al. ............. 439/82 |
| 4,973,544 A | * | 11/1990 | Slayman et al. ............. 430/322 |
| 5,329,423 A | | 7/1994 | Scholz ........................ 257/738 |
| 5,400,220 A | | 3/1995 | Swamy ........................ 361/760 |
| 5,442,852 A | * | 8/1995 | Danner ........................ 29/843 |
| 5,459,287 A | | 10/1995 | Swamy ........................ 174/266 |
| 5,477,086 A | | 12/1995 | Rostoker et al. ............. 257/780 |
| 5,541,135 A | | 7/1996 | Pfeifer et al. .................. 437/60 |
| 5,599,747 A | * | 2/1997 | Bhatt et al. .................. 437/209 |
| 5,632,631 A | | 5/1997 | Fjelstad et al. ............... 439/82 |
| 5,759,737 A | * | 6/1998 | Feilchenfeld et al. ........ 430/311 |
| 5,770,891 A | | 6/1998 | Frankeny et al. ............ 257/778 |
| 5,783,368 A | * | 7/1998 | Richter et al. ............... 430/315 |
| 5,810,609 A | | 9/1998 | Faraci et al. ................. 257/780 |
| 5,812,378 A | | 9/1998 | Fjelstad et al. ............... 439/82 |
| 5,953,594 A | * | 9/1999 | Bhatt et al. .................. 438/125 |
| 6,037,667 A | * | 3/2000 | Hembree et al. ............ 257/779 |
| 6,041,495 A | * | 3/2000 | Yoon et al. ................... 29/841 |
| 6,207,354 B1 | * | 3/2000 | Bhatt et al. .................. 430/313 |
| 6,071,809 A | * | 6/2000 | Zhao ........................... 438/634 |
| 6,084,297 A | * | 7/2000 | Brooks et al. ............... 257/698 |
| 6,138,350 A | * | 10/2000 | Bhatt et al. .................... 29/852 |
| 6,165,885 A | * | 12/2000 | Gaynes et al. ............... 438/612 |
| 6,199,273 B1 | * | 3/2001 | Kubo et al. .................... 29/843 |
| 6,205,660 B1 | * | 3/2001 | Fjelstad et al. ............... 29/885 |
| 6,207,548 B1 | * | 3/2001 | Akram et al. ............... 438/613 |

FOREIGN PATENT DOCUMENTS

| | | | |
|---|---|---|---|
| JP | 40-6104261 A | 4/1994 | ................. 257/737 |
| WO | 08-9002653 | 3/1989 | ................. 257/737 |

OTHER PUBLICATIONS

Lorenz, et al., "Epon Su–8: A Low Cost Negative Resist For Mems," Suss Report, vol. 10, pp. 1–3 (1996).

* cited by examiner

*Primary Examiner*—Janet Baxter
*Assistant Examiner*—Amanda C. Walke
(74) *Attorney, Agent, or Firm*—Workman, Nydegger & Seeley

(57) ABSTRACT

A socket assembly for removably receiving a solder ball of a chip package and methods for forming the same. The socket assembly is a raised construction formed over a substrate and includes a socket, a ball contact structure, and an electrical trace. A relatively thick photoresist layer, which may have a thickness in a range from about 20 microns to about 450 microns, is used in the process of forming the socket assembly. The photoresist layer may have formed therein a patterned opening used as a mold for the socket assembly. Alternatively, the photoresist layer may be an integral and permanent component of the socket assembly. The socket assembly is configured such that a solder ball may be disposed in the socket so as to be electrically connected to the socket assembly. Optionally, the socket assembly includes one or more ball penetration structures for facilitating the establishment of electrical contact and for adapting the socket assembly to solder balls of different dimensions. The socket assembly limits the amount of vertical deformation of the solder ball so that the chip package remains reusable.

33 Claims, 16 Drawing Sheets

METHOD OF MAKING A SOCKET ASSEMBLY FOR USE WITH A SOLDER BALL

RELATED APPLICATIONS

This is a divisional application of U.S. patent application Ser. No. 09/139,168, filed on Aug. 24, 1998, now U.S. Pat. No. 6,037,667, titled SOCKET ASSEMBLY FOR USE WITH SOLDER BALL.

BACKGROUND OF THE INVENTION

1. The Field of the Invention

The present invention relates to substrates that include an array of sockets for receiving a ball grid array chip package. More particularly, the present invention relates to methods for forming an array of sockets and associated electrical traces wherein a relatively thick photoresist layer is used to construct the sockets and traces.

2. The Relevant Technology

Frequently, after an integrated circuit is manufactured, a testing process is conducted on the integrated circuit by subjecting it to preselected set of input conditions in order to measure its response or other parameters. Such testing is often conducted after a semiconductor die has been packaged. As used herein, the terms "packaged chip" and "chip package" refer to an integrated circuit or another semiconductor structure that has been combined with external and additional structure. The term "semiconductor structure" extends to any device or assembly that includes circuitry defined in a semiconductive material, and further extends to a chip package that includes semiconductive material. The external and additional structure may be used, for example, for mounting the semiconductor structure to a printed circuit board or other external circuitry, for establishing electrical connection between the semiconductor structure and external circuitry, for improving the ease of handling or transporting the semiconductor structure, or for protecting the semiconductor structure from environment al conditions.

A common chip package design is a ball grid array package (BGA), in which an array of solder balls are arranged over at least one surface of the chip package in a position and with dimensions that are selected so as to easily establish electrical connection with external circuitry.

Testing a packaged chip is conventionally accomplished by connecting electrical leads on the packaged chip to testing circuitry in order to determine the reliability and accuracy of the integrated circuit's response to a predetermined set of input conditions. Of course, testing is best conducted in a manner such that the tested packaged chips remain in a condition for use without any additional processing. Likewise, it is important to conduct testing such that the testing device can be easily and quickly reused for testing a subsequent integrated circuit.

In order to ensure the reusability of both the tested packaged chip and the testing device, there have been developed mounting surfaces on testing devices that are adapted to receive and make electrical connection with a packaged chip. Typically, such mounting surfaces include an array of electrical contact points that correspond to the pattern of an array of solder balls on a surface of a BGA package.

An example of a substrate to which a ball grid array package may be temporarily mounted is seen in FIG. 1. The assembly includes a substrate 10 which may be any one of a wide number of dielectric materials in which a pit or depression 12 is formed. A via 14 is formed through substrate 10 so as to have an opening at opposite sides of substrate 10. A conformal metal layer 16 is disposed over selected portions of the surfaces of substrate 10 as seen in FIG. 1. In particular, conformal metal layer 16 coats the surfaces of pit 12, the inner surfaces of via 14, and provides an electrical trace 18 therebetween. In this manner, pit 12 is electrically connected with via 14 such that electrical connection may be established with external testing circuitry.

A ball grid array package 20 is disposed over substrate 10 such that solder ball 22 is aligned with pit 12. In practice, of course, substrate 10 typically includes a plurality of pits 12 while BGA package 20 includes a corresponding plurality of solder balls 22. BGA package 20 is pressed down onto substrate 10 such that solder ball 22 partially enters pit 12. In so doing, solder ball 22 makes electrical contact with conformal metal layer 16.

Because solder is significantly more malleable than the metal of conformal metal layer 16, solder ball 22 deforms upon being partially inserted into pit 12. When BGA package 20 is mounted on substrate 10, solder balls 22 are typically not subjected to heat that is sufficient to cause melting or other significant deformation thereof. Instead, BGA package 20 is ordinarily clamped onto substrate 10 to secure it in place. After testing is complete, the clamping pressure is removed and solder ball 22 may be retracted from pit 12. If the method of mounting BGA package 20 to substrate 10 is successful, a tested BGA package 20 typically remains in a condition to be used in the same manner as an untested BGA package.

Despite the advantages of the assembly seen in FIG. 1, certain problems have been presented during the manufacturing of substrate 10 and the use thereof in testing an integrated circuit. For example, the formation of pits 12 and vias 14 require a number of individual manufacturing steps. For example, a drilling, punching, or etching operation must be used to form via 14 and an etching step or other suitable process must be used to form pit 12 in substrate 10 before conformal metal layer 16 may be deposited thereon.

Another common problem in the industry is that individual solder balls arrayed on a BGA package may vary in size one from another by 20% or more. This variation may be in the vertical dimension of the solder ball, in its lateral diameter dimension, or in both. When such variation is experienced, it may be impossible to cause each solder ball 22 to simultaneously contact the corresponding pit 12 in substrate 10. For example, if one solder ball is significantly shorter than the others, such a solder ball may fail to penetrate pit 12. Likewise if a solder ball has an exceptionally small diameter, the solder ball may penetrate the pit without making contact with the conformal metal layer. When this occurs, the testing operation cannot be conducted because electrical signals and power are not delivered to each solder ball.

Furthermore, when electrical conductive paths, such as electrical trace 18, are formed with relatively small width and thickness dimensions, the resulting resistance of the conductive paths may be greater than ideal values, particularly when using materials with less than optimum conductivity characteristics. However, current practices for forming mounting substrates for testing devices involve inherent limitations as to the maximum thickness of the electrical conductive paths that may be formed. Moreover, increasing the width of electrical paths in order to reduce resistance values may not be a suitable solution. In particular, wide electrical traces may have correspondingly high capacitance characteristics, which may induce noise in the testing operation. In addition, the physical dimensions of the chip package and the mounting substrate may further constrain the width dimensions of the electrical traces.

In view of the foregoing, there is a need in the art for a socket that can reliably receive a solder ball of a BGA package such that the BGA package remains reusable. It would be an advancement in the art to provide such a socket that is also capable of making electrical contact with solder balls of varying sizes. It would be a further advantage to provide methods of manufacturing such sockets in a cost-effect manner. There is also a need in the art for a socket and associated structure that may be formed with dimensions that produce relatively low electrical resistance values.

SUMMARY OF THE INVENTION

The present invention is directed to socket assemblies that are configured to receive a solder ball of a ball grid array packet and methods for forming the same. A socket assembly is defined herein as a structure that includes at least a socket and a ball contact structure at least partially surrounding the socket. The socket assemblies of the invention are typically formed by using a relatively thick photoresist layer to form a pattern that corresponds to the desired shape of the socket ball contact structure and electrical trace. An array of socket assemblies are ordinarily arranged over a surface of an interposer which may be used to electrically connect a ball grid array package with external circuitry contained in a testing device.

In all embodiments of the invention, the socket assemblies preferably include a ball contact structure having an inner sidewall, an outer sidewall, a base disposed on a substrate, and a top surface opposite the base. The socket assembly also includes a socket defined by the inner sidewall of the ball contact structure and by the substrate. The socket is at least partially surrounded by the ball contact structure and may be completely circumscribed thereby. In general, the ball contact structure comprises a raised construction that is disposed on the substrate while the socket includes an opening or a void that is substantially defined by the ball contact structure. The socket has dimensions selected such that a solder ball of a ball grid array package may be partially inserted therein. In addition, the socket assemblies generally include an electrical trace extending away from the ball contact structure and disposed on the substrate.

In a first embodiment of the invention, the ball contact structure and the electrical trace are substantially composed of one or more conductive materials, which are preferably metals. The socket assembly is formed by first providing a substrate having a substantially planar surface. Next, a seed metal layer is formed over the substantially planar surface and is patterned so as to correspond to the ball contact structure and the electrical trace that are to be subsequently formed thereover. The patterned seed metal layer is formed by first coating the substrate with a thin layer of metal. Next, a masking structure is formed on the conductive layer from a photoresist material or another suitable material in a pattern that corresponds to the socket assembly that is to be formed. In particular, the masking structure remains on the thin layer of metal at the region over which the ball contact structure and the electrical trace will later be formed. The exposed portion of the thin layer of metal is etched and the masking structure is removed, thereby forming the patterned seed metal layer.

A photoresist layer having a thickness preferably in a range from about 20 microns to about 450 microns is then spun onto the substrate and the patterned seed metal layer. Alternatively, successive layers of photoresist material may be spun on to achieve the desired thickness in a process known as "resist stacking". The photoresist layer is exposed and patterned, whereby photoresist material is removed from a region generally aligned with the remaining portion of the underlying patterned seed metal layer.

After patterning of the photoresist layer, the substrate is placed in an electrolytic bath wherein an electroplating process is conducted to form a metal layer over the seed metal layer and within the patterned opening. This electroplated metal layer is to constitute the bulk of the ball contact structure and the electrical trace. The electroplating process continues until the electroplated metal layer has a desired thickness. Finally, the photoresist layer is stripped from the substrate, including from the socket that is adjacent to the ball contact structure.

In a second embodiment of the invention, a substrate having a substantially planar surface is provided and a photoresist layer is spun onto the surface. Preferably, the photoresist layer has a thickness in a range from about 20 microns to about 450 microns. Alternatively, two or more successive layers of photoresist material may be spun on to achieve the desired thickness. A conductive layer, which preferably includes at least one metal, is then formed on the photoresist layer. The conductive layer preferably has a thickness that is significantly smaller than the thickness of the photoresist layer. A masking structure is formed on the conductive layer from a photoresist material or another suitable material in a pattern that corresponds to the socket assembly that is to be formed. In particular, the masking structure remains on the conductive layer over the region that will later constitute the ball contact structure and the electrical trace. Portions of the conductive layer and the photoresist layer are consecutively removed such that essentially the only material remaining on the substrate is that which had been positioned under the masking structure. In this manner, a ball contact structure and an electrical trace are formed, each of which comprise a dual layer structure having an underlying photoresist layer and an overlying and relatively thin conductive layer.

A third embodiment of the invention involves forming a ball contact structure and an associated socket in the same manner as in the second embodiment. However, the electrical trace is not formed at the same time as the ball contact structure, but is instead formed afterwards. Accordingly, the third embodiment proceeds after a ball contact structure of the second embodiment has been formed, at which point a first conformal metal layer is formed over the exposed surfaces. An anisotropic etching process, known in the art as a spacer etch, is used to remove part of the first conformal layer, while leaving a portion of the first conformal metal layer on the sidewalls of the ball contact structure. Next, a second conformal metal layer is formed over the substrate, the ball contact structure, and the remaining portion of the first conformal layer.

A patterned photoresist layer is provided over selected portions of the second conformal metal layer in a position that corresponds to the electrical trace that is to be formed. During a subsequent anisotropic etch, the photoresist layer acts as an etch mask such that a part of the second conformal metal layer is removed, while a portion of the second conformal metal layer remains over the substrate and forms an electrical trace. This electrical trace is electrically connected to the ball contact structure and has a thickness that is significantly less than the thickness of the ball contact structure.

In view of the foregoing, it can be appreciated that the present invention provides methods for forming a ball contact structure and an associated socket without requiring the formation of pits, depressions, or vias into the substrate. Instead, a substrate having a substantially planar surface may be used, thereby eliminating the additional substrate patterning steps that have been common in the prior art. In particular, the present invention uses a relatively thick photoresist layer to form the socket assemblies so as to improve the cost-effectiveness of the manufacturing process over that which has been experienced in the past. In addition, the electrical traces may be formed with thicknesses much greater than has been previously possible, thereby allowing the electrical traces to exhibit relatively low electrical resistance values.

In addition, the present invention includes certain features that permit the sockets of the invention to adequately make electrical contact with solder balls of varying sizes. For example the invention optionally includes a plurality of ball penetration structure integrally formed on the ball contact structure. Preferred ball penetration structures include ribs, fins, blades, and the like that are integrally formed on the inner sidewall of the ball contact structure. These ball penetration structures protrude radially inward from the inner sidewall into the socket. Typically, a ball penetration structure according to the invention may be described as having a longitudinal axis that is substantially radially aligned with respect to the socket and that is generally perpendicular to a tangent of the inner sidewall at the junction of the inner sidewall and the ball penetration structure. The width of the ball penetration structure, measured in a direction perpendicular to the longitudinal axis thereof and parallel to the plane defined by the substrate, is selected such that the ball penetration structure may easily cut into a solder ball and be embedded therein.

These optional ball penetration structures may be included in the socket assemblies so as to facilitate electrical connection between a solder ball and a socket assembly without significantly deforming the solder ball in the vertical direction. In particular, as the solder ball is pressed into the socket, the ball penetration structures first make contact with the solder ball and become at least partially embedded therein. Because the ball penetration structures have a width that is significantly smaller than the diameter of the solder ball, they are designed or sized to penetrate the solder ball without causing significant deformation of the solder ball, especially in the vertical direction. Preferably, the ball penetration structures cut into the lateral portions of the solder ball and not into the spherical "crown", or lower portion. Such ball penetration structures permit an array of sockets to make contact with an array of solder balls on a BGA package even if there is variation in the sizes of the individual solder balls.

The socket assemblies of the invention allow a ball grid array package to be easily placed in electrical connection with external circuitry while preserving the ability of the BGA package to be reused in its final intended product. Moreover, the socket assemblies of the present invention are sufficiently raised above the surface of the substrate such that a clearance remains between the bottom of the socket and the solder ball. This clearance ensures that the solder ball is not vertically deformed by making contact with the substrate, with the result that the crown of the solder ball is not flattened.

In some circumstances, for manufacturing efficiency reasons, it may be advantageous to modify the first embodiment in order to reduce the thickness to which the electroplated metal layer is formed. Accordingly, in a fourth embodiment of the invention, a pit or a depression is formed in a substrate prior to conducting the remainder of the processing steps of the first embodiment. Subsequently, the socket assembly is formed over the substrate in a position such that the socket is opened over the depression. This configuration allows a reduction of the thickness of the electroplated metal layer by an amount substantially equal to the depth of the depression. In particular, the socket maintains an adequate aspect ratio such that a clearance is maintained between a solder ball and the substrate, while the depth of the electroplated metal layer is reduced.

A fifth embodiment of the invention is similar to the fourth embodiment, with the variation that the depression is replaced with a via extending through the substrate. This allows the electroplated metal layer to be significantly thinner than may be possible without the via. In the fifth embodiment, the via is optionally plated with a conductive layer, which may then replace the electrical trace that otherwise extends across the surface of the substrate.

Thus, it will be appreciated that the present invention provides a socket assembly that preserves the reusability of solder balls, is capable of being used with solder balls of varying dimensions, and may be formed by cost-effective manufacturing processes.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are therefore not to be considered limiting of its scope, the invention will be described with additional specificity and detail through the use of the accompanying drawings in which.

DETAILED DESCRIPTION OF THE PREFERRED EMBODIMENTS

The present invention relates to socket assemblies adapted to receive a solder ball of a BGA package and which are formed according to processes that utilize a relatively thick photoresist layer. The photoresist layers are processed in one or more of several alternative procedures in order to form a raised structure that includes a conductive layer. Such a raised structure acts as part of a socket assembly, which includes at least a ball contact structure and an associated socket. Such a raised socket assembly has dimensions that are sufficient to provide a clearance between a solder ball and the substrate while providing electrical contact between the solder ball and external circuitry. An array of socket assemblies formed according to the invention may be arranged over the surface of an interposer.

For purposes of illustration, the examples of the invention presented herein generally depict the invention adapted for use with solder balls of a ball grid array package. However, it should be understood that other chip packages or semiconductor dice are compatible with the principles taught herein. For example, the socket assemblies of the invention may be readily adapted for use with flip chip dice, chip scale packages, or other semiconductor structures having an array of exposed electrical contact points, particularly those which have electrical contact points that are generally spherical, hemispherical, domed, or that otherwise protrude from a surface of the structure.

Figure 1:
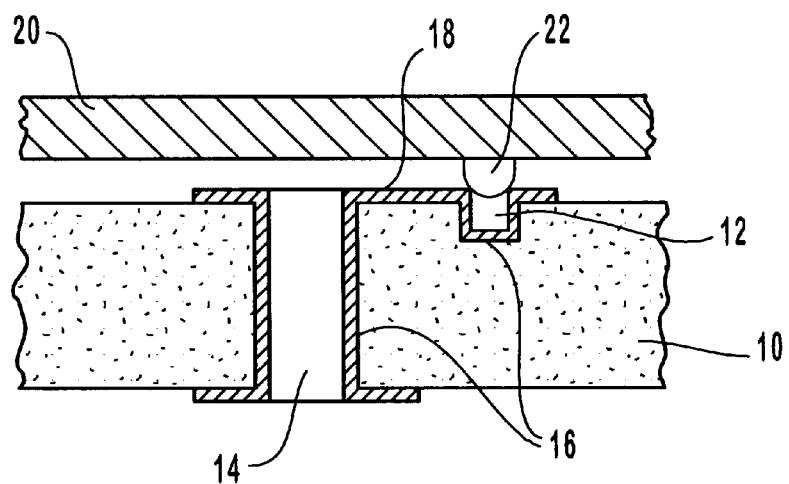
FIG. 1 is a cross-sectional elevation view of an assembly wherein a solder ball of a BGA package is inserted into a socket of a substrate. The socket includes a pit formed into the substrate and the assembly further includes a via formed through the substrate.
Figure 2:
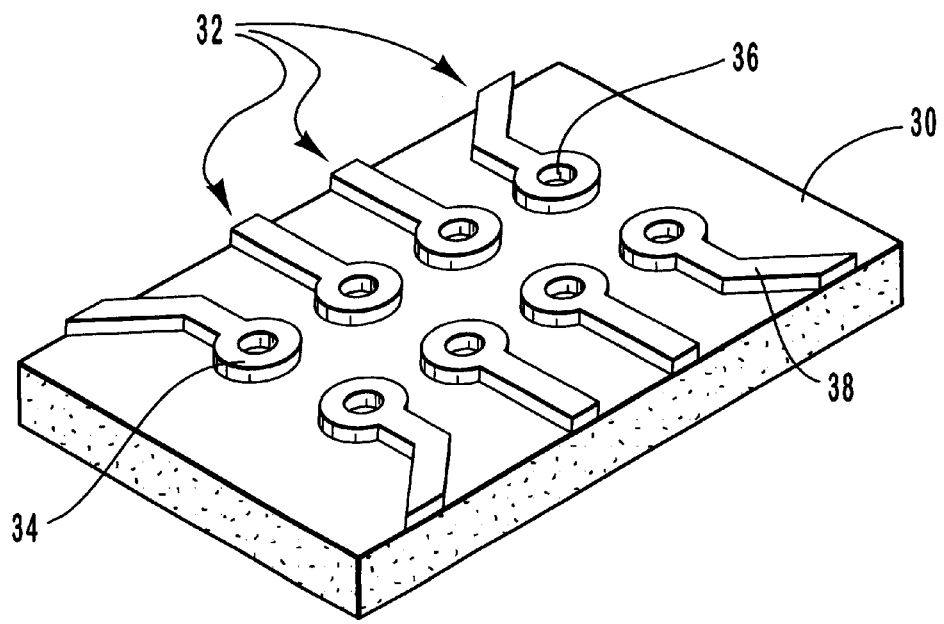
FIG. 2 is a is a perspective view of an interposer formed according to the invention wherein a plurality of socket assemblies are formed over a substrate.

FIGS. 2–5 illustrate examples of preferred socket assemblies. FIG. 2 illustrates an interposer substrate 30 over which are arrayed a plurality of socket assemblies 32. Each socket assembly 32 includes a ball contact structure 34, a socket 36 and an electrical trace 38. The array of socket assemblies 32 are patterned on interposer substrate 30 such that sockets 36 have the same central line pattern as the solder balls of a chip package assembly that is to be positioned thereon. In this manner, a chip package assembly may be placed in electrical contact with the plurality of socket assemblies 32 and in turn electrically connected to external circuitry.

Figure 3:
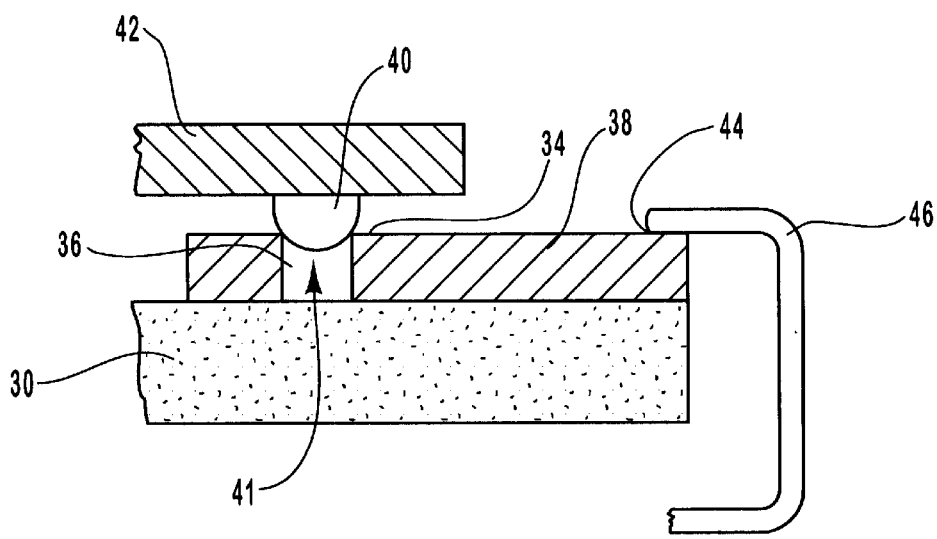
FIG. 3 is a cross-sectional elevation view of an assembly wherein a solder ball of a chip package is inserted into a socket. A ball contact structure associated with the socket is disposed over a substantially planar surface of a substrate.

FIG. 3 illustrates a solder ball 40 of a chip package assembly 42 having been positioned within socket 36 of one of the socket assemblies of FIG. 2. The dimensions of socket 36 are selected to correspond to the dimensions of solder ball 40. Under one option, a plurality of ball penetration structures extend into the socket to assist in making electrical connection with the solder ball. A socket having such hall penetration structures is illustrated and disclosed in more detail below. In an alternative option as seen in FIGS. 2 and 3, no ball penetration structures are present. In such an alternative configuration, socket 36 preferably has an inside diameter that is slightly less than the outside diameter of solder ball 40. When the foregoing relationship exists, solder ball 40 may be securely and removably placed in contact with ball contact structure 34.

It is generally desirable to prevent solder ball 40 from touching substrate 30 in order to avoid causing vertical deformation of solder ball 40 and deformation of the solder ball's spherical crown. Moreover, when the diameter of socket 36 is selected according to the above-specified relationship, the point of contact on solder ball 40 is located nearer to the side thereof than to the bottom thereof. This further ensures that vertical deformation of solder ball 40 is limited.

As used herein, "vertical deformation" is intended to refer to a change in the vertical dimension of a solder ball, wherein the vertical dimension is the distance between the body of the ball grid array package and the point on the solder ball that is most distally positioned thereto, and is measured in a direction perpendicular to the plane defined by substrate 30. If some vertical deformation is to be experienced by the solder balls, such vertical deformation is preferably uniform among all the solder balls of a chip package. The "crown" or "spherical crown" of a solder ball is generally defined as the region of the solder ball immediately adjacent to, and including, the point on the solder ball most distally located to the substrate.

The ratio of the depth of socket 36 to the width of socket 36, or the aspect ratio, is preferably selected to be great enough to prevent contact between solder ball 40 and substrate 30. When socket 36 does not include the ball penetration structures that will be disclosed in greater detail below, the aspect ratio of socket 36 is preferably somewhat greater than 1:2. This ratio assumes that solder ball 40 generally has the form of at least half of a sphere. The ratio is typically at least slightly greater than 1:2 because it is recognized that solder ball 40 generally deforms when disposed in socket 36. However, it is understood that the aspect ratio may have any suitable value that prevents solder ball 40 from contacting substrate 30 when solder ball 40 is disposed in socket 36. While there is no fixed upper limit to the aspect ratio of socket 36, factors that would tend to reduce the aspect ratio include the physical limitations of forming a pattern in a photoresist material and the cost of forming increasingly thick layers of material over a substrate.

Electrical trace 38 preferably extends from ball contact structure 34 to a terminal contact pad 44. It will be understood that terminal contact pad 44 is intended to extend to any conductive surface of the socket assembly which may be in electrical communication with solder ball 40 and to which external circuitry may be connected. By way of example, and not by limitation, a terminal contact pad may be adapted to electrically engage a socket, a probe, a wirebonded lead, conductive tape, a solder contact, or the like. The external circuitry may be included in a circuit board, a testing apparatus, a power source, or any other desired structure. In the example of FIG. 3, terminal contact pad 44 includes a surface to which wire 46 is bonded.

Figure 4A:
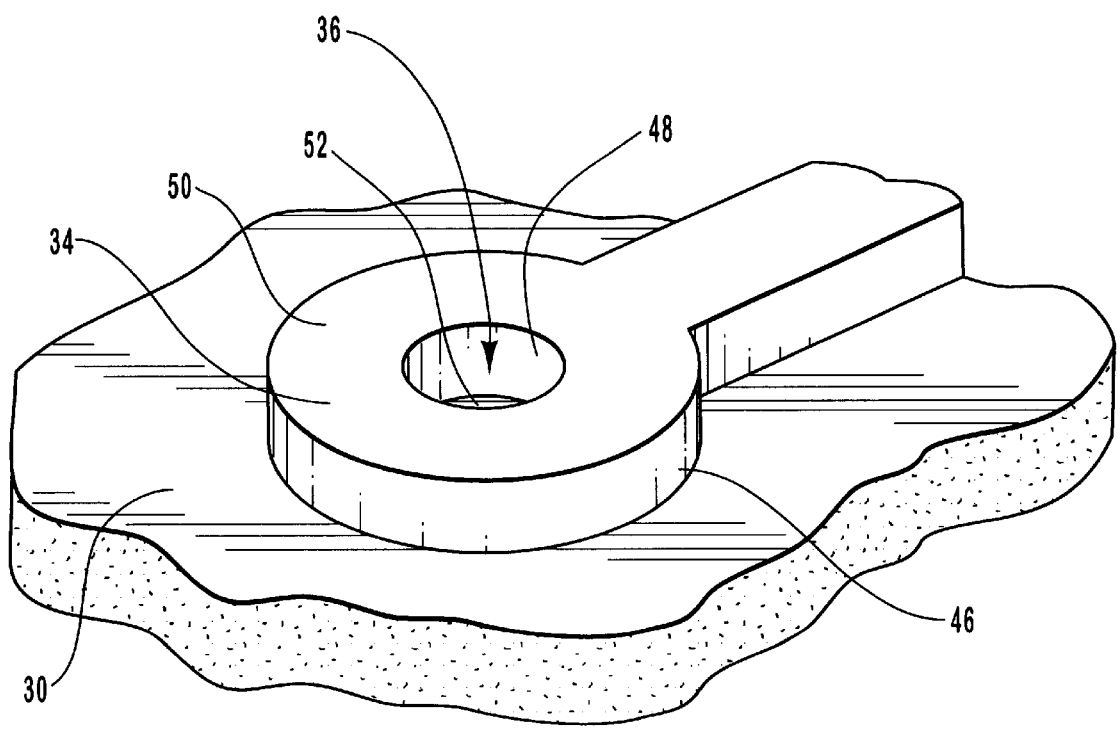
FIG. 4A is an enlarged perspective view of one of the socket assemblies of FIG. 2.
Figure 4B:
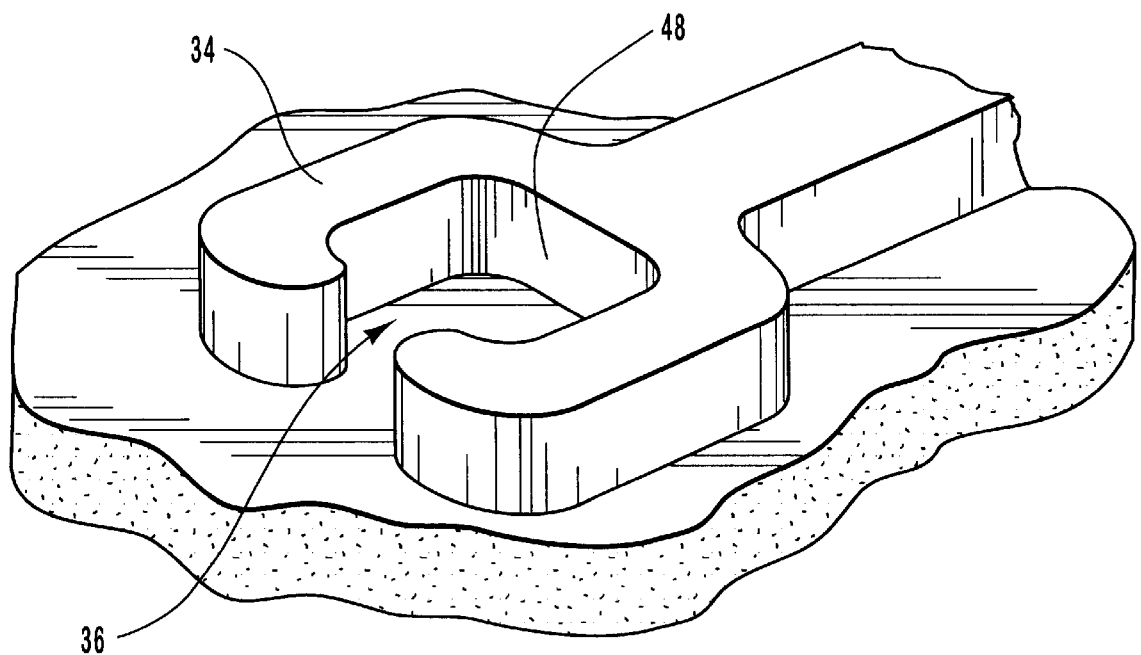
FIG. 4B is a perspective view of an alternative configuration of a socket assembly.
Figure 4C:
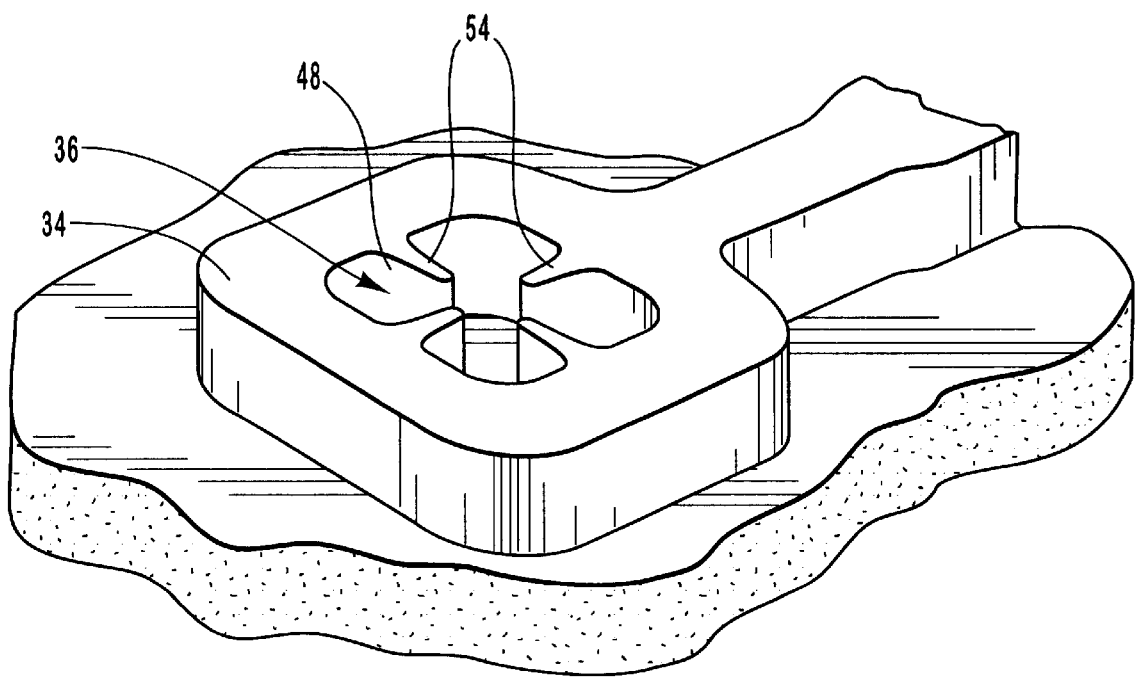
FIG. 4C is a perspective view of another alternative configuration of a socket assembly wherein a plurality of ball penetration structures extend into the socket.

FIGS. 4A–4C present by way of example, and not by limitation, alternative socket assemblies that may be formed according to the processes disclosed herein. FIG. 4A illustrates in greater detail one of the socket assemblies of FIG. 2. The socket assembly is seen as having a ball contact structure 34 which includes an outer sidewall 46, an inner sidewall 48, a base (not shown) disposed on substrate 30, and an opposite top surface 50. Socket 36 is defined a by a lateral wall that is substantially coextensive with inner sidewall 48 and by a bottom 52 that is substantially coextensive with a region of substrate 30.

FIG. 4B depicts an alternative configuration of a socket assembly in which socket 36 is not fully circumscribed by inner sidewall 48 of ball contact structure 34. Instead, socket 36 is only partially surrounded by inner sidewall 48. In other respects, however, the principle of operation of the sockets of FIGS. 4A and 4B are similar, in that they are adapted to receive and make electrical contact with a solder ball.

FIG. 4C illustrates an alternative configuration of a socket assembly, wherein a plurality of ball penetration structures 54 are integrally formed on inner sidewall 48. Ball penetration structures under the invention include any structure that extends away from ball contact structure 34 in the direction of the region where a solder ball is to be received. Such ball penetration structures are optionally included in the socket assemblies of the invention to facilitate electrical connection with a solder ball while limiting the vertical deformation of the solder ball.

According to the foregoing broad functional characteristics of preferred ball penetration structures, specific examples thereof include, but are not limited to, ribs, fins, blades, and the like that are integrally formed on inner sidewall 48. Such ball penetration structures advantageously protrude radially inward from inner sidewall 48 into socket 36. Typically, a ball penetration structure according to the invention may be described as having a longitudinal axis that is substantially radially aligned with respect to the socket and that is substantially perpendicular to a tangent of the inner sidewall at the junction of the inner sidewall and the ball penetration structure. However, other ball penetration structures are also contemplated under the invention.

The width of the ball penetration structure, measured in a direction perpendicular to the longitudinal axis thereof and parallel to the plane defined by substrate 30, is selected such that the ball penetration structure may easily cut into a solder ball and be embedded therein. It will be understood that ball penetration structures that adequately perform the foregoing functions may have a wide range of width dimensions. By way of example, however, it has been found that a width in a range from about 1/20 to about 1/25 of the diameter of the solder ball provides good penetration with limited vertical deformation of the solder ball.

Figure 5:
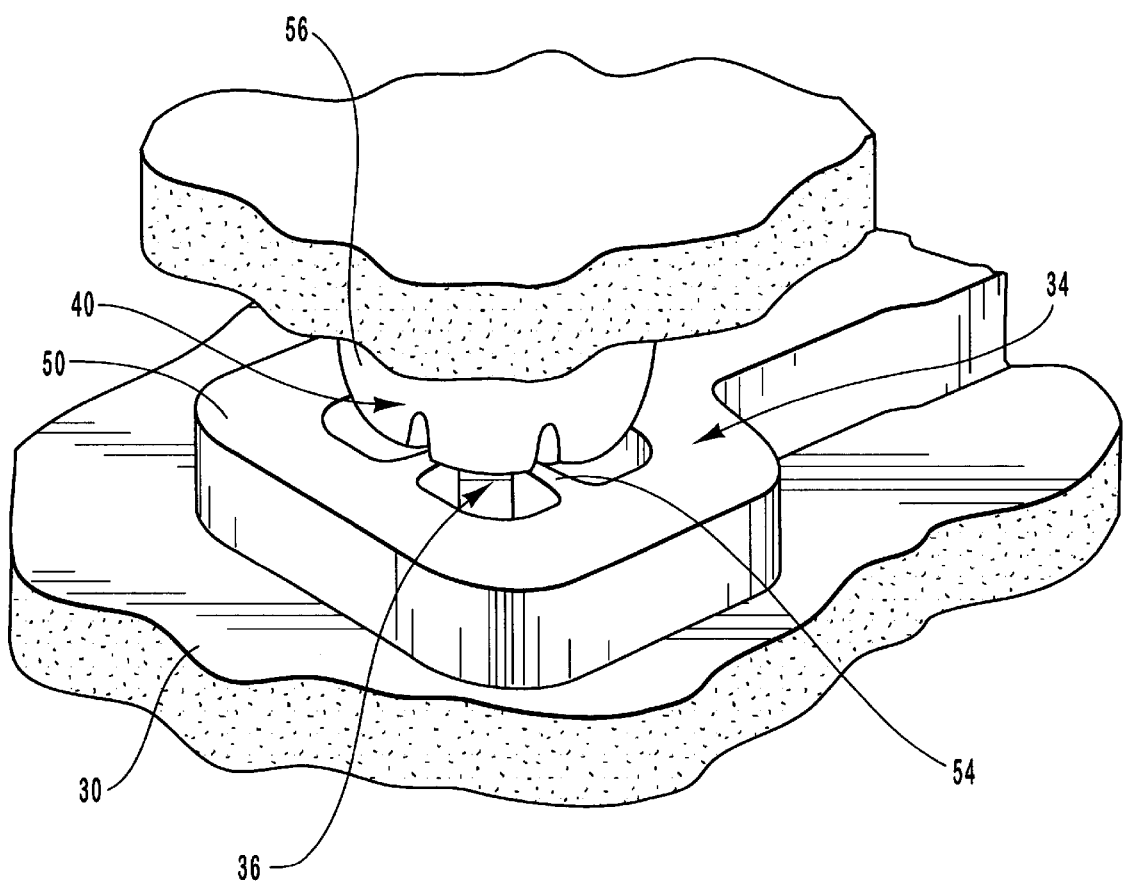
FIG. 5 is a perspective view of a solder ball of a chip package assembly having been engaged with ball penetration structures and a socket.

A socket 36 that includes ball penetration structures may have an aspect ratio that is less than that which is generally required for sockets without ball penetration structures. This reflects the fact that a solder ball 40 may not fully penetrate a socket 36 when the socket assembly includes ball penetration structures 54, as illustrated in FIG. 5. In particular, FIG. 5 shows a solder ball 40 having been brought into engagement with socket 36. As solder ball 40 is pressed into socket 36, outer surface 56 of solder ball 40 first makes contact with ball penetration structures 54. These ball penetration structures 54 cut through outer surface 56 substantially without causing vertical deformation of solder ball 40. In many instances, penetration of solder ball 40 may stop before contact is made with any structure of the socket assembly other than ball penetration structures 54. Nonetheless, it is to be understood that, for purposes of convenience, the term "ball contact structure" as used in reference to ball contact structure 34 is intended to extend to such instances.

It can be appreciated that ball penetration structures 54 permit a socket assembly such as that seen in FIG. 5 to be used in conjunction with solder balls having diameters that widely vary. In particular, ball penetration structures 54 permit electrical connection to be established early in the process of causing solder ball 40 to penetrate socket 36, and individual solder balls arrayed over a BGA package need not make contact with their corresponding socket assembly at the same precise moment. Furthermore, ball penetration structures 54 have the further advantage of breaking through a native oxide layer that may have formed on solder ball 40, thereby improving the resulting electrical connection.

Figure 6A:
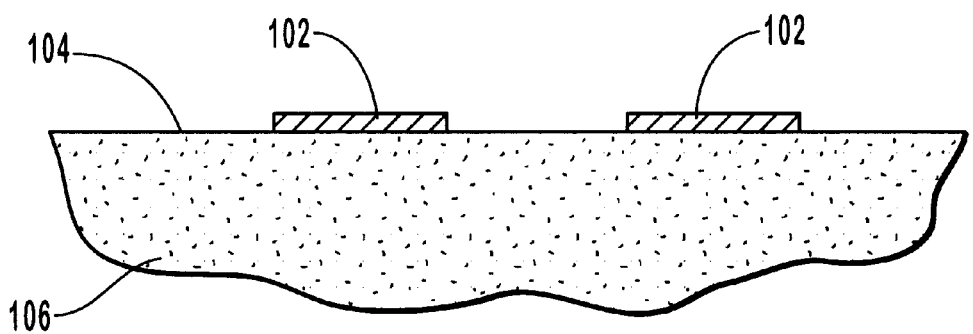
FIG. 6A is a cross-sectional elevation view of a preliminary stage of the process of forming a socket assembly according to a first embodiment of the invention in which a seed metal layer is formed and patterned over a substrate.

FIGS. 6A–9 depict the formation of a socket assembly according to a first embodiment of the invention. As seen in FIG. 6A, this method preferably includes forming a seed metal layer 102 over a substantially planar surface 104 of substrate 106 by means of sputter deposition or another suitable process. Seed metal layer is formed, by way of example, to a depth in a range from about 0.5 microns to about 3 microns over as much as the entire substantially planar surface 104 of substrate 106. The primary purpose of seed metal layer 102 is to provide an electrode for a subsequent electroplating operation. Seed metal layer 102 is patterned by removing metal therefrom while causing seed metal layer 102 to remain in those locations over which the ball contact structure and the electrical trace of the socket assembly are to be formed. The foregoing patterning operation may be conducted according to processes that may be well known in the art. A preferred seed metal layer 102 includes copper, although any other material which may form an electrode in an electroplating operations can be used.

Substrate 106 should be dielectric at least to the extent that individual socket assemblies are substantially electrically isolated one from another as desired. A wide range of materials or combinations of materials may be used in substrate 106 and the other substrates disclosed herein. For example, the substrates may include ceramics, glass, polymeric and other organic materials and the like. Specific examples of the foregoing include fiberglass, silica glass or other silicon materials, and aluminum oxide. Preferably, the material used for the substrate should have a coefficient of thermal expansion relatively close to that of the ball grid array package or other semiconductor structure that will be mounted thereover. Moreover, the substrates are preferably constructed from a sufficiently rigid material so as to retain a substantially planar overall form, thereby ensuring that an array of solder balls may be repeatedly and reliably placed in contact with the socket assemblies. Although the substrates preferably retain a substantially planar overall form, the surface of the substrates may include surface features that depart from planarity. Accordingly, substantially planar surface 104 may be replaced with a surface that has other surface characteristics.

Figure 6B:
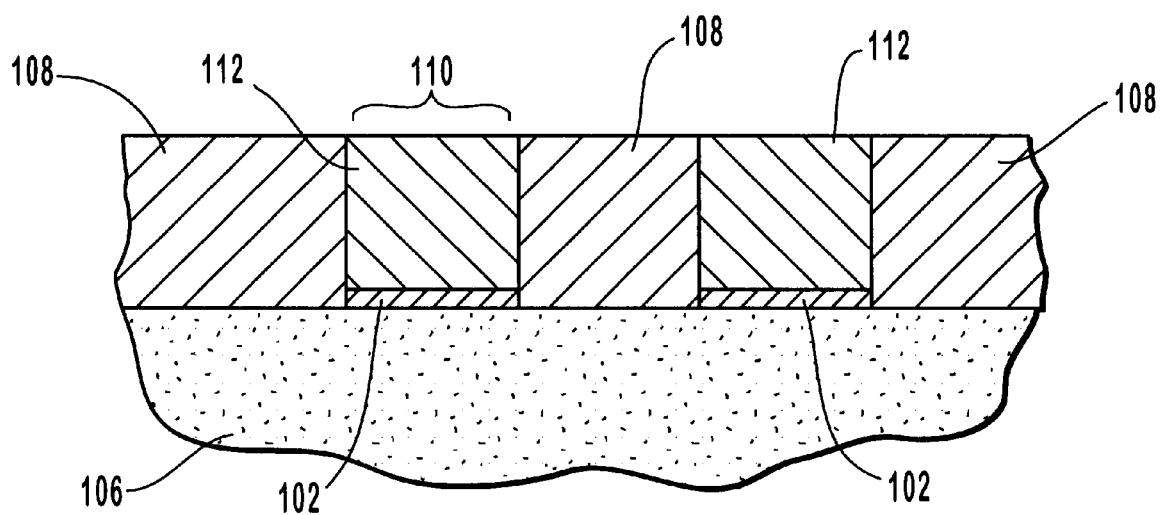
FIG. 6B is a cross-sectional elevation view of the structure of FIG. 6A after a relatively thick photoresist layer has been formed, a patterned opening has been formed in the photoresist layer, and a conductive layer has been positioned in the patterned opening.

Next, as illustrated in FIG. 6B, a relatively thick photoresist layer 108 is spun-on or otherwise formed over substrate 106 and seed metal layer 102. The thickness of the photoresist layer 108 is preferably selected to be at least as great as the desired thickness of the fully-formed ball contact structure. Generally, it is preferable to form a photoresist layer to a thickness of at least about 20 microns. Photoresist layer 108 ordinarily does not require a thickness greater than about 450 microns, although the invention may extend to thicknesses greater than this value.

A photoresist material and a process for preparing the photoresist material are taught in U.S. Pat. No. 4,882,245 to Gelorme, which is incorporated herein by reference. The photoresist material of Gelorme is a preferred material for use in photoresist layer 108 and other photoresist layer disclosed herein, except where otherwise noted. More preferably, the photoresist layers of the invention comprise a negative tone photoresist material of Gelorme wherein a primary constituent thereof is a resin having the trade name EPON® Resin SU-8, which is available from Shell Chemical Co. of Houston, Tex. EPON® Resin SU-8 is a polyepoxyfunctional novalac resin with a functionality of about eight, and is capable of being cured in response to a cationic photoinitiator.

The resin is dissolved in a reactive diluent, which is defined as a diluent that is capable of reacting or crosslinking with the resin during a curing operation. Examples of the reactive diluent include organic solvents such as gamma-butyloracton and cycloalaphatic epoxides. The quantity of the solvent determines the viscosity of the preparation and the hardness of the photoresist material upon application to a substrate. Therefore, the concentration of the solvent also determines the thickness of the photoresist material that can be achieved.

A cationic photoinitiator is included in the preparation, and may be a photoinitiator that produces cationic acids or other cations upon exposure to electromagnetic radiation. Examples of suitable cationic photoinitiators include triarylsulphonium salts, although other materials may be used.

The foregoing photoresist material is preferred because it can be spun onto a substrate to a relatively large thickness. For example, thicknesses of at least 450 microns have been achieved by controlling the viscosity of the photoresist preparation. The foregoing photoresist material is also advantageously used in the invention because openings having aspect ratios as high as 15:1 or greater are possible.

Although the foregoing photoresist material is preferred, it should be understood that substantially any photoresist material may be used so long as is can be formed to a suitable thickness. For example, if the desired ball contact structure has a thickness of 100 microns, the photoresist material used in the photoresist layer is preferably able to be formed to a thickness of about 100 microns or more.

Photoresist layer 108 is then patterned according to conventional methods such that a patterned opening 110 is formed therein. Patterned opening 110 is preferably selected so as to be substantially vertically aligned with the remaining portion of seed metal layer 102.

Next, substrate 106 and the structures formed thereon are preferably positioned in an electroplating bath in which a conductive layer 112 is formed over seed metal layer 102 and within patterned opening 110. Conductive layer 112 is preferably formed to a depth that is equal to the desired final thickness of the ball contact structure, or is slightly less than such final thickness, since optional metal films may be formed over conductive layer 112 as described hereinafter.

The thickness of conductive layer 112 is also preferably formed to a thickness that is in a range from slightly greater than the thickness of photoresist layer 108 to substantially less than the thickness of photoresist layer 108. Once the thickness of the electroplated metal of conductive layer 112 exceeds the thickness of photoresist layer 108, the metal is no longer bound by patterned opening 110 and may begin to generate undesirable results if allowed to continue to deepen. It is also apparent that if the thickness of conductive layer 112 is very small in comparison to photoresist layer 108, much of photoresist layer 108 could be considered to have been wasted. Accordingly, it is most preferable to form conductive layer 112 to a thickness that is nearly equal to that of photoresist layer 108.

Conductive layer 112 may by any suitable metal or metals that may be deposited in an electroplating operation. Copper is a preferred examples of a metal for use in conductive layer 112. It should be understood that while electroplating is the preferred method of forming conductive layer 112, other conventional processes may be used. Some processes of forming a metal layer do not require seed metal layer 102, in which case, seed metal layer 102 may be eliminated.

Figure 7A:
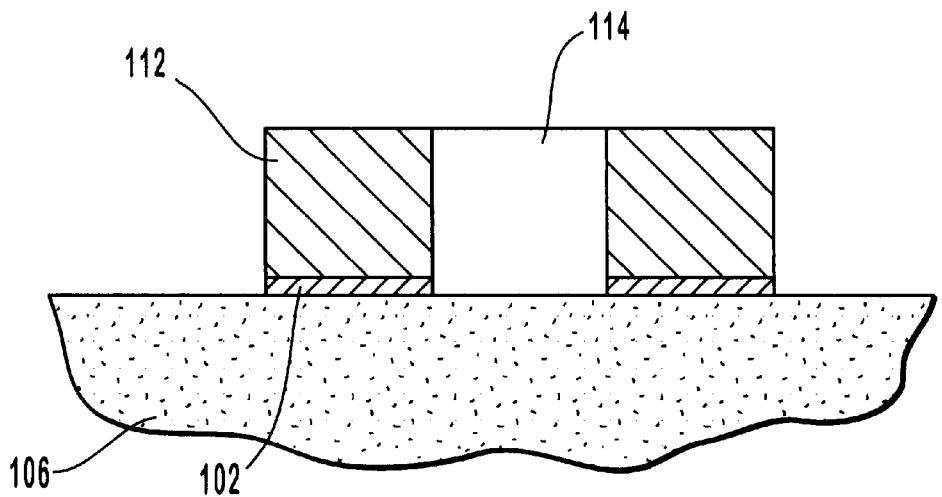
FIG. 7A is a cross-sectional elevation view of the structure of FIG. 6B after the photoresist layer has been removed.

After formation of conductive layer 112, photoresist layer 108 is at least partially removed. Preferably, photoresist layer 108 is removed from at least socket 114 as illustrated in FIG. 7A. Such removal of photoresist layer 108 clears socket 114 of obstruction and leaves it in condition to receive a solder ball. Preferably, photoresist layer 108 is substantially completely stripped or otherwise removed from substrate 106.

Figure 7B:
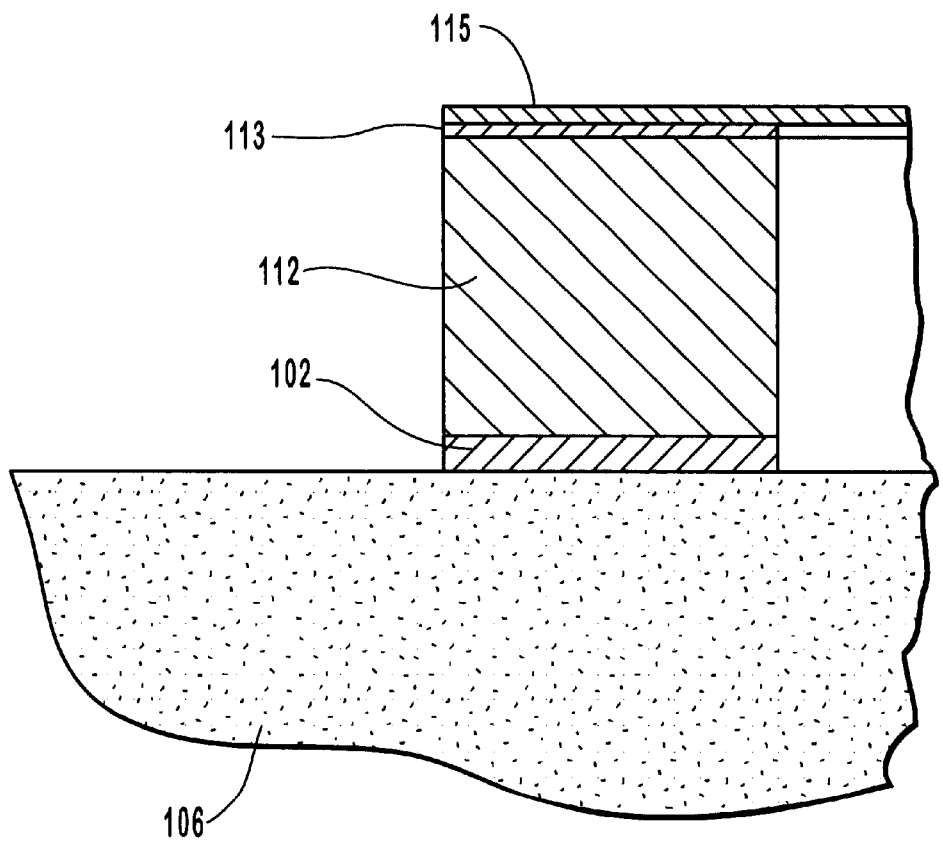
FIG. 7B is a partial cross-sectional elevation view of the structure of FIG. 7A depicting conductive films formed thereover.

Depending on the composition of conductive layer 112, one or more additional conductive or conditioning films may be advantageously formed thereover. Such films may be used to improve the wirebonding or soldering qualities of the completed structure or may be used as a barrier layer between conductive metal layer 112 and the corresponding solder ball. For example FIG. 7B shows a barrier layer 113 that may include nickel, tungsten, or another suitable material. First barrier layer 113 is preferably included if conductive layer 112 includes copper, and functions to prevent copper from conductive layer 112 from migrating into a lead/tin alloy of the solder ball and vice versa.

In addition, a second barrier layer 115 may be formed on first barrier layer 113 or on conductive layer 112. Such a second barrier layer 115 may be advantageously used if a welding or soldering operation is to be conducted on the terminal contact pad of the socket assembly. For example, gold or silver are suitable materials that facilitate good contact between wirebond leads and a terminal contact pad. Accordingly, since copper is not a good material for forming a metallurgical bond with wirebonded leads, second barrier layer 115 may be formed thereover to improve such wirebonding. Moreover, because gold readily migrates into copper, second barrier layer 115 may be advantageously separated from conductive layer by nickel or some other material included in first barrier layer 113. First barrier layer 113 and second barrier layer 115, when included in the socket assemblies of the invention, may be formed by electroplating or another suitable process, and may be applied before or after removal of photoresist layer 108.

Figure 8:
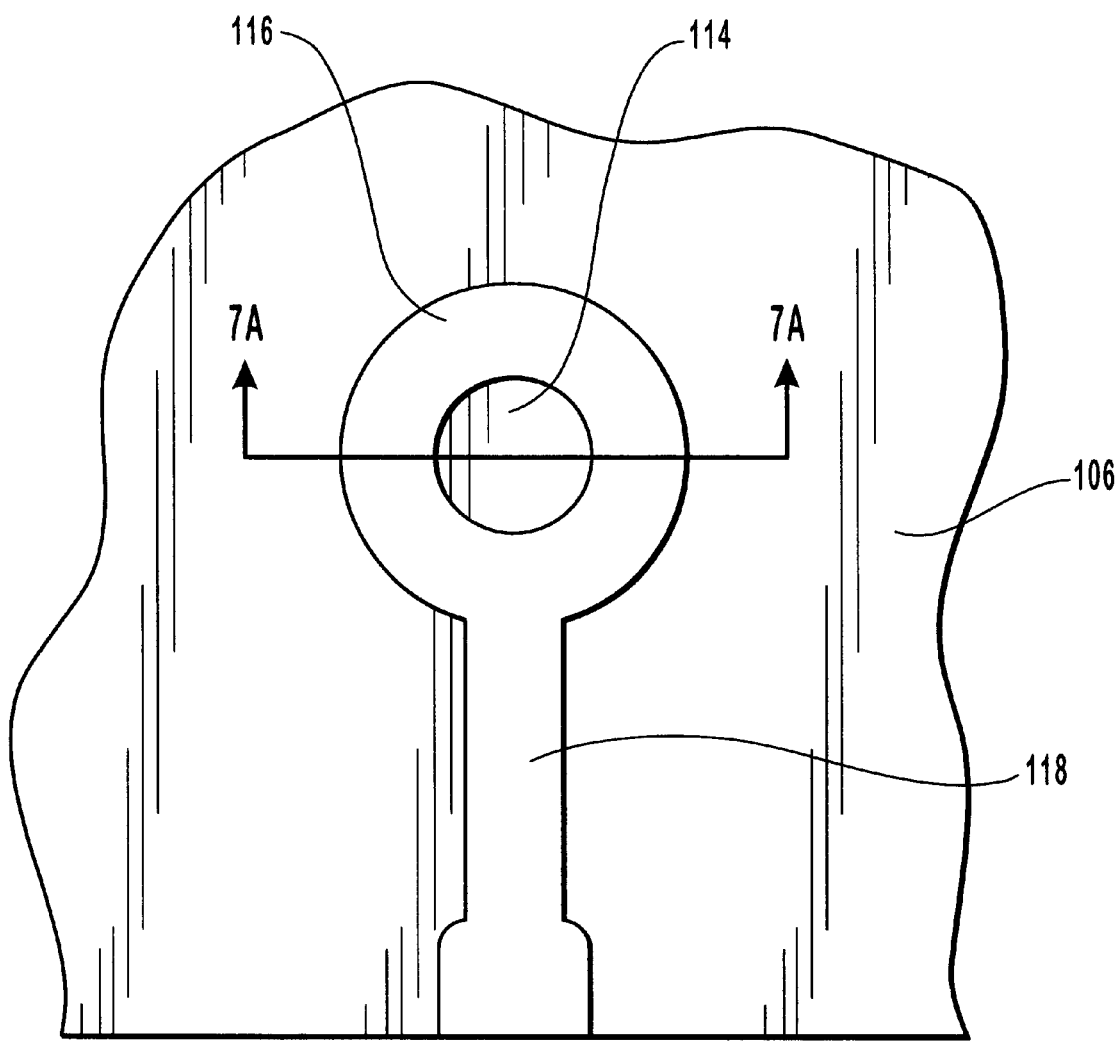
FIG. 8 is a top view of the socket assembly of FIG. 7A.
Figure 9:
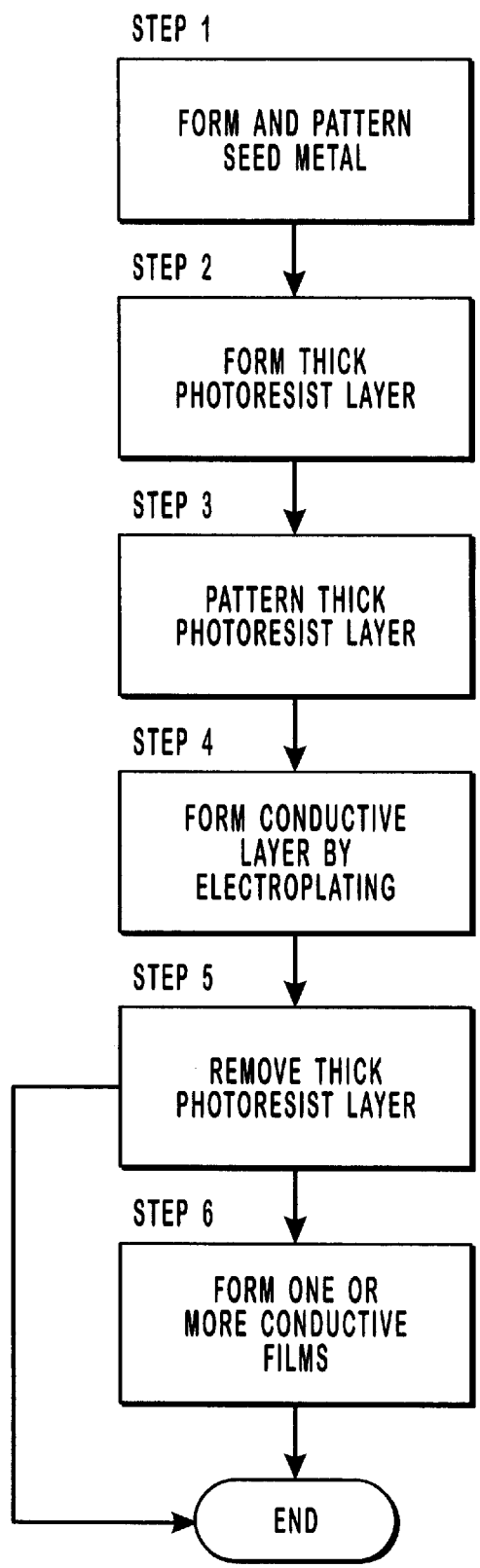
FIG. 9 is a flow chart indicating the steps of forming the socket assembly of FIG. 8.

FIG. 8 depicts the socket assembly of FIG. 7A, including socket 114, ball contact structure 116, and electrical trace 118 and further identifies the cross sectional plane seen in FIG. 7A. The socket assembly may further include ball penetration structures as disclosed herein. FIG. 9 is a flow chart listing preferred steps of the process of forming the socket assembly according to this first embodiment.

FIGS. 10–13 depict the formation of a socket assembly according to a second embodiment of the invention. This second embodiment utilizes a relatively thick photoresist layer as a permanent component of the completed socket assembly. The process first includes forming multiple layers over a substrate 206 that preferably has a substantially planar surface 204. The multiple layers include a photoresist layer 208, a conformal conductive layer 220, and a masking structure 222.

Photoresist layer 208 is preferably composed of the same material or materials as photoresist layer 108, which is described above in reference to FIGS. 6A–9. The bulk of the thickness of the completed ball contact structure is to be provided by photoresist layer 208. Accordingly, the thickness of photoresist layer 208 is selected to correspond to the requirements of the completed socket assembly. By way of example, and not by limitation, the thickness of photoresist layer 208 may be in a range from about 20 microns to about 450 microns. Conformal conductive layer 220 includes any suitable conductive material, a preferred example being copper, and is formed on photoresist layer 208 by sputter deposition or another suitable operation. A preferred thickness of conformal conductive layer 220 is in a range from about 1 micron to about 12 microns, but is not limited thereto.

Masking structure 222 is formed over conformal conductive layer 220 and patterned so as to substantially cover the region of the underlying layers that are to become the ball contact structure and the electrical trace. At the same time, a region of conformal conductive layer 220 is exposed through the pattern defined by masking structure 222. Preferably, masking structure 222 consists of a photoresist material that has been spun on and patterned. Masking structure 222 may comprise, for example, any photoresist material that may be used in patterning and etching layers in semiconductor manufacturing and the related art. Moreover, unlike photoresist layer 208, masking structure 222 may be relatively thin.

Figure 10:
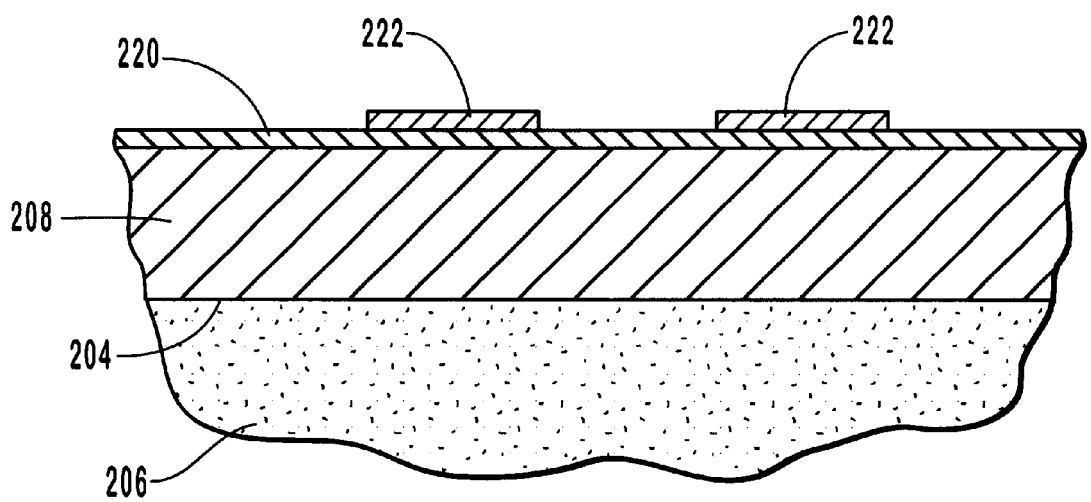
FIG. 10 is a cross-sectional elevation view depicting a preliminary stage of the process of forming a socket assembly according to a second embodiment of the invention wherein a patterned upper photoresist layer has been formed over a conformal conductive layer, which is in turn disposed over a lower photoresist layer.
Figure 11:
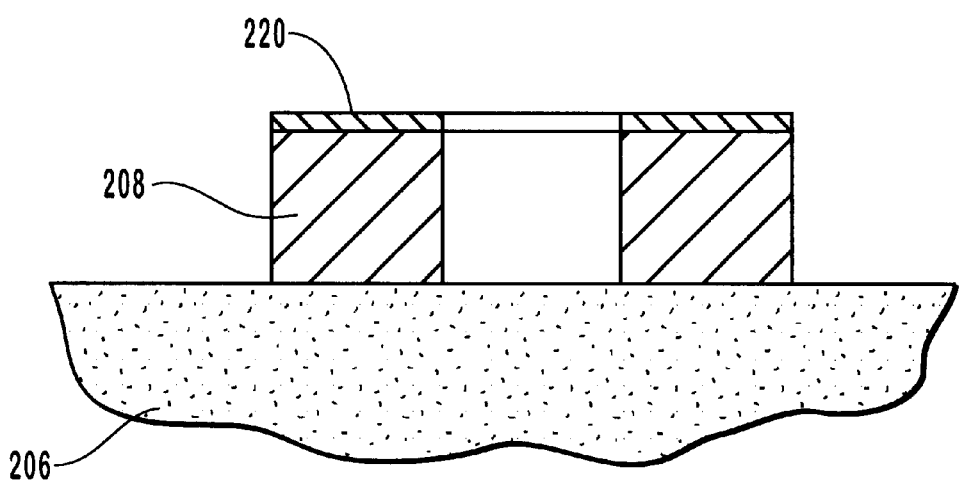
FIG. 11 is a cross-sectional elevation view of the structure of FIG. 10 after consecutive etching operations have been conducted to form a ball contact structure and an associated socket.

FIG. 11 depicts the structure of FIG. 10 after an anisotropic etching operation and a subsequent process of removing photoresist material have been conducted thereon. In particular, an etching operation is used to remove conformal conductive layer 220 except the portions thereof that are positioned below and are protected by masking structure 222. The etching operation forms a patterned opening in conformal conductive layer 220 through which a region of photoresist layer 208 is exposed. This etching operation may be conducted according to methods that are known in the art, including dry or wet etching techniques. Thereafter, a material removal operation is conducted to remove photoresist layer 208 except portions thereof that are positioned below and are protected by the remaining portion of conformal conductive layer 220. This material removal operation may be any suitable procedure by which photoresist material may be removed. Moreover, masking structure 222 is also removed from the remaining structure.

As described above in reference to the first embodiment, depending on the composition of conformal conductive layer 220, there may be advantageously formed thereover one or more conductive films to improve the wirebonding or soldering qualities of the completed structure or to act as a barrier layer between conformal conductive layer 220 and the corresponding solder ball.

Figure 12:
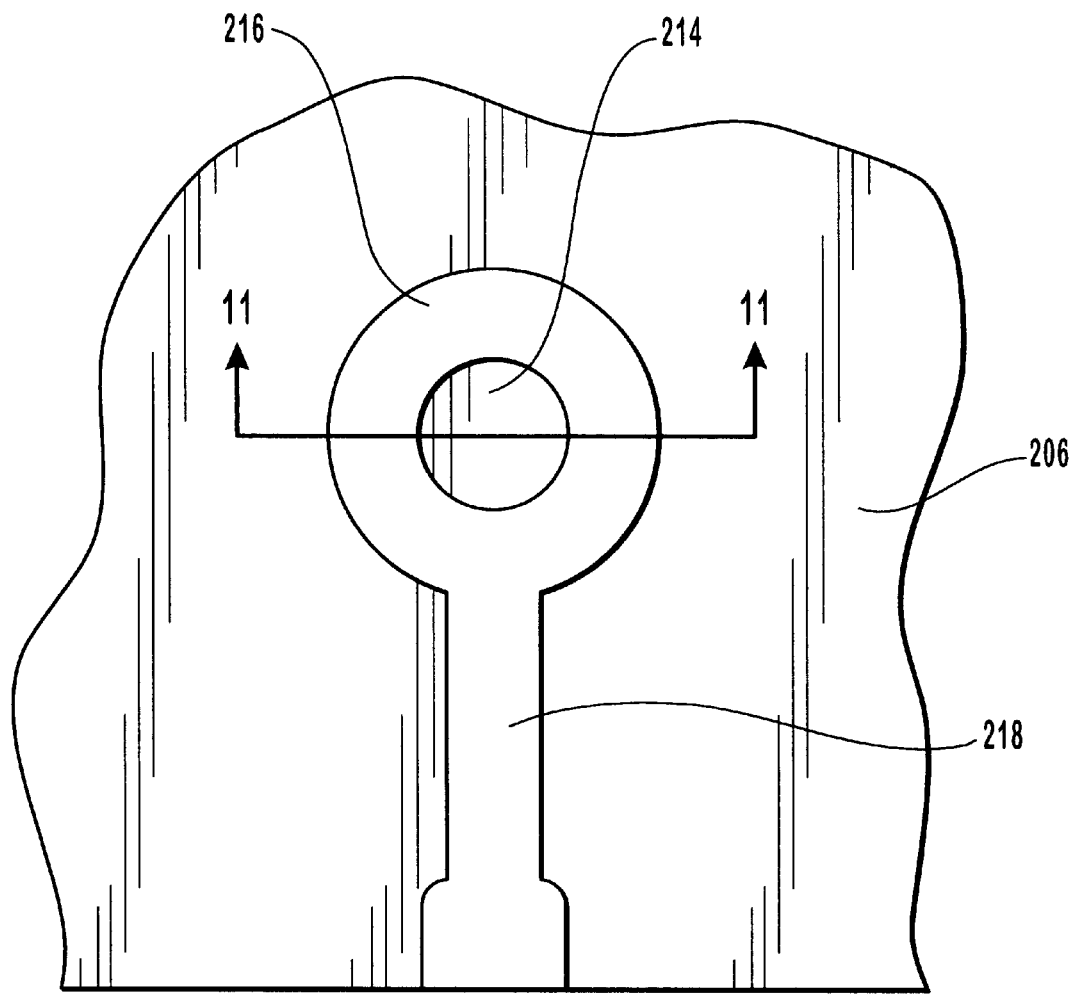
FIG. 12 is a top view of the socket assembly of FIG. 11.
Figure 13:
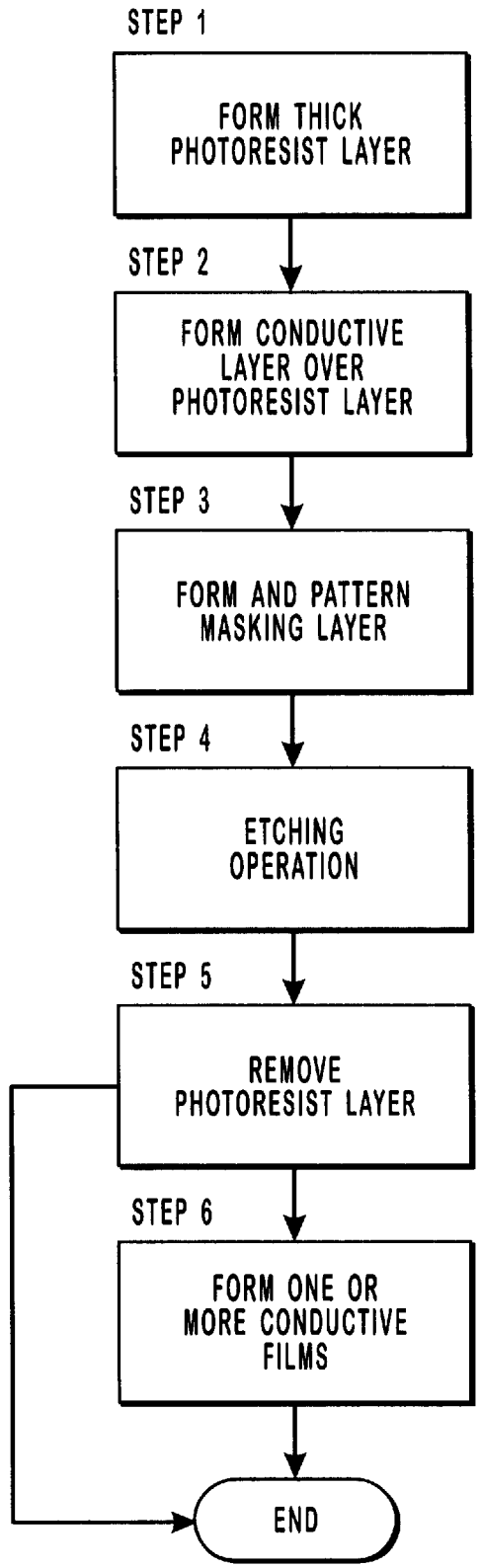
FIG. 13 is a flow chart depicting the steps in the process of forming the socket assembly of FIG. 12.

When the socket assembly of FIG. 11 is completed, photoresist layer 208 acts as a platform structure that supports conformal conductive layer 220 and separates it from substrate 206. The completed socket assembly preferably includes at least a socket 214, ball contact structure 216 and an electrical trace 218 disposed over substrate 206 as seen in FIG. 12, which also illustrates the cross-sectional plane of FIG. 11. Moreover, the socket assembly may include the ball penetration structures that are described herein. FIG. 13 is a flow chart that depicts preferred steps involved in forming the socket assembly of FIG. 12.

FIGS. 14–20 illustrate a socket assembly and the method for forming the same according to a third embodiment of the invention. This third embodiment involves forming a structure similar to socket 214 and ball contact structure 216 of the second embodiment with additional steps provided to form an electrical trace that has a much lower profile than electrical trace 218 of the second embodiment.

Figure 14:
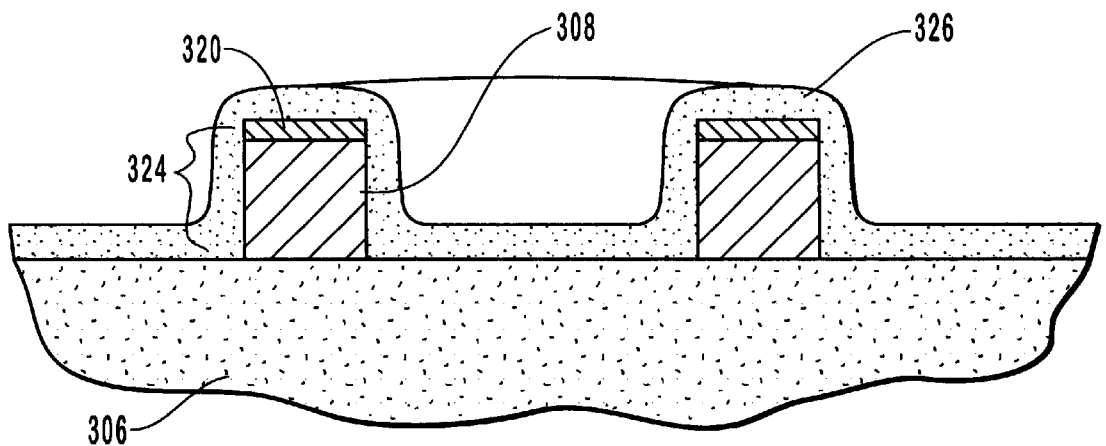
FIG. 14 is a cross-sectional elevation view of a preliminary stage in the process of forming a socket assembly according to a third embodiment of the invention wherein a first conformal conductive layer is disposed over a multilayer structure that includes a lower photoresist layer and an upper conductive layer.

FIG. 14 illustrates multilayer structure 324 having been formed according to the process of forming ball contact structure 216 of FIG. 12. In particular, multilayer structure 324 includes a photoresist layer 308 disposed over substrate 306 and a conductive layer 320 positioned on photoresist layer 308. Next, a first conformal conductive layer 326 is formed on exposed surfaces including those of substrate 306 and multilayer structure 324. First conformal conductive layer 326 may comprise any suitable metal, a preferred example being copper.

Figure 15:
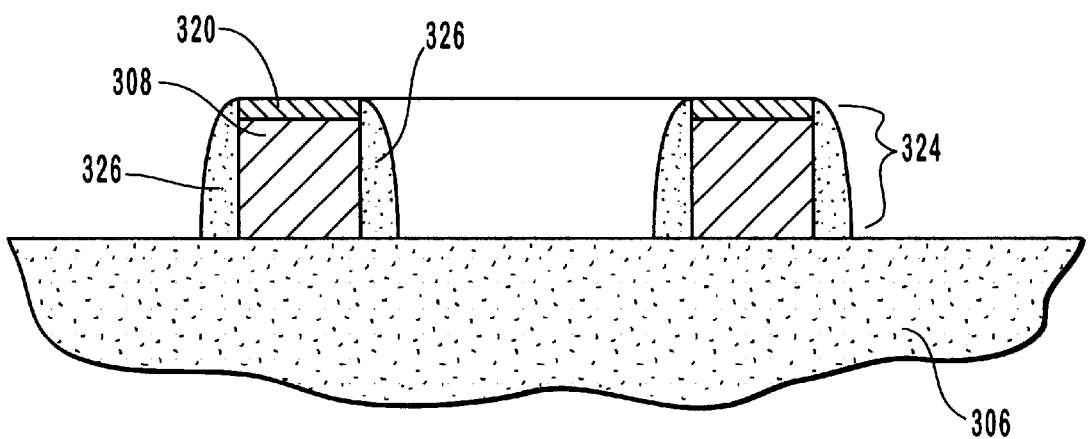
FIG. 15 is a cross-sectional elevation view of the structure of FIG. 14 after an anisotropic etch has been conducted on the first conformal conductive layer.

FIG. 15 illustrates the structure of FIG. 14 after an anisotropic etch known in the art as a spacer etch has been conducted on the first conformal conductive layer. A portion of first conformal conductive layer 326 remains on at least one sidewall of multilayer structure 324. Accordingly, photoresist layer 308 is substantially covered with conductive material contained in both the first conformal conductive layer 326 and conductive layer 320. Next, in FIG. 16 a second conformal conductive layer 328 is formed on the exposed surfaces including those of substrate 306, first conformal conductive layer 326, and conductive layer 320. Second conformal conductive layer 328 may be a metal film that includes the same or a dissimilar metal from that which is included in first conductive layer 326. A masking layer 330 is then formed and patterned such that the region where an electrical trace is to be formed is shielded from a subsequent etch. Masking layer 330 preferably comprises a photoresist material, which may be relatively thin, and which may be any suitable photoresist material used in semiconductor manufacturing and the related art.

Figure 16:
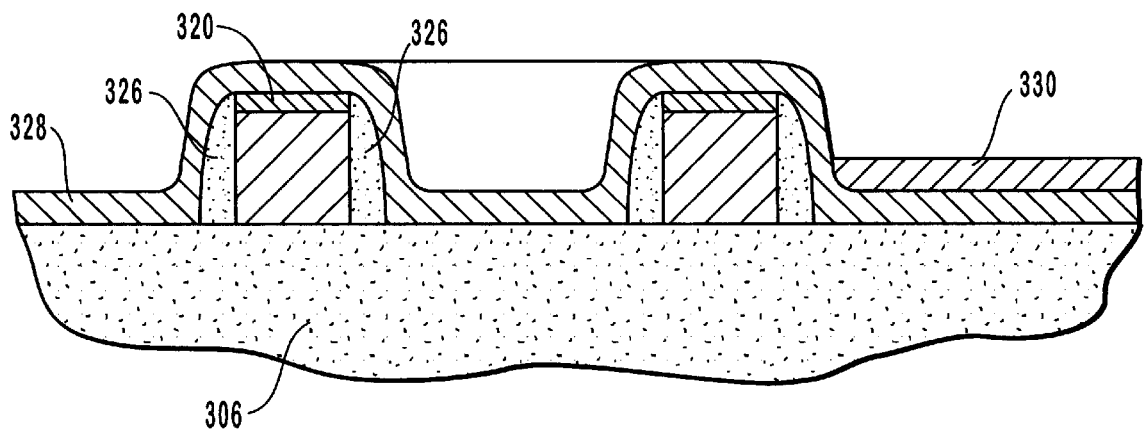
FIG. 16 is a cross-sectional elevation view of the structure of FIG. 15 after a second conformal conductive layer and a masking photoresist layer have been disposed thereon.
Figure 17:
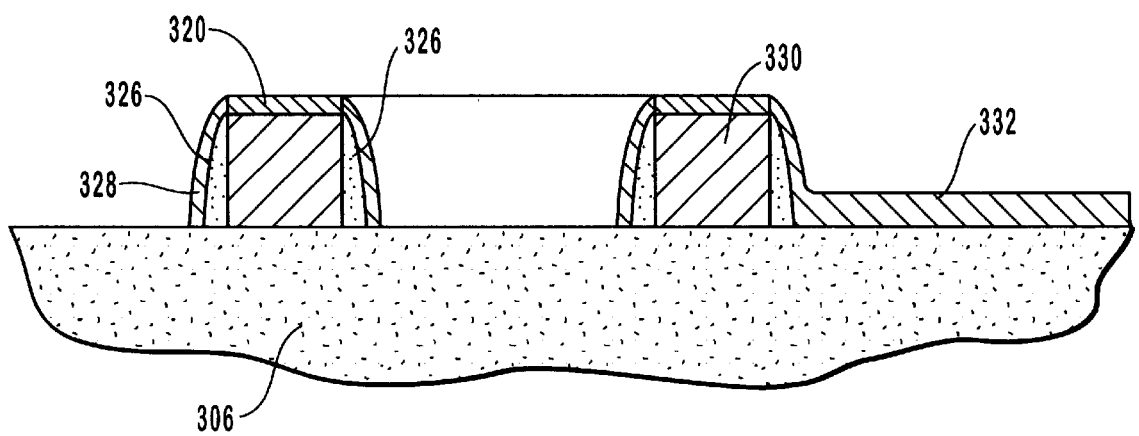
FIG. 17 is a cross-sectional elevation view of a socket assembly formed from the structure of FIG. 16 after an anisotropic etching operation has been conducted.

FIG. 17 illustrates the structure of FIG. 16 after a second anisotropic etch has been conducted on second conformal conductive layer 328. Alternatively, the second etch may be an isotropic process. It can be seen that conductive material is removed from second conformal conductive layer 328, particularly at locations disposed over horizontal or generally horizontal surfaces. A portion 332 of second conformal conductive layer 328 that lies below and is protected by masking photoresist layer 330 remains intact and generally constitutes an electrical trace 332 of the socket assembly. As seen in FIG. 17, electrical trace 332 is in electrical contact with the conductive material that is positioned on photoresist layer 308. By way of example, and not by limitation, the thickness of second conformal conductive layer 328 is selected such that electrical trace 332 has a thickness in a range from about 0.1 microns to about 150 microns.

It should be understood that the socket assembly according to this third embodiment may be formed without the first conformal conductive layer 324. Instead, second conformal conductive layer 328 may serve both to cover a sidewall of multilayer structure 324 and to form the electrical trace 332.

Figure 18:
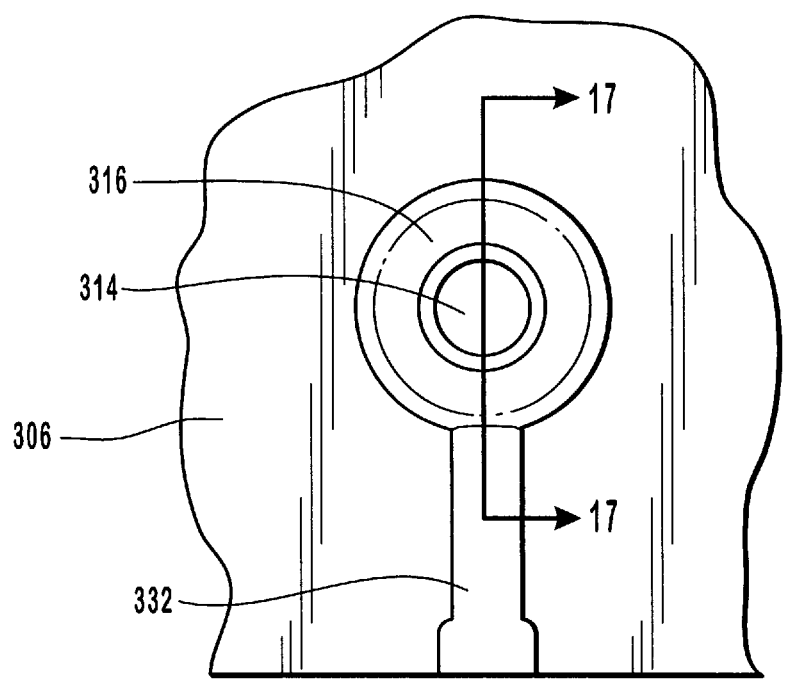
FIG. 18 is a top view of the socket assembly of FIG. 17.
Figure 19:
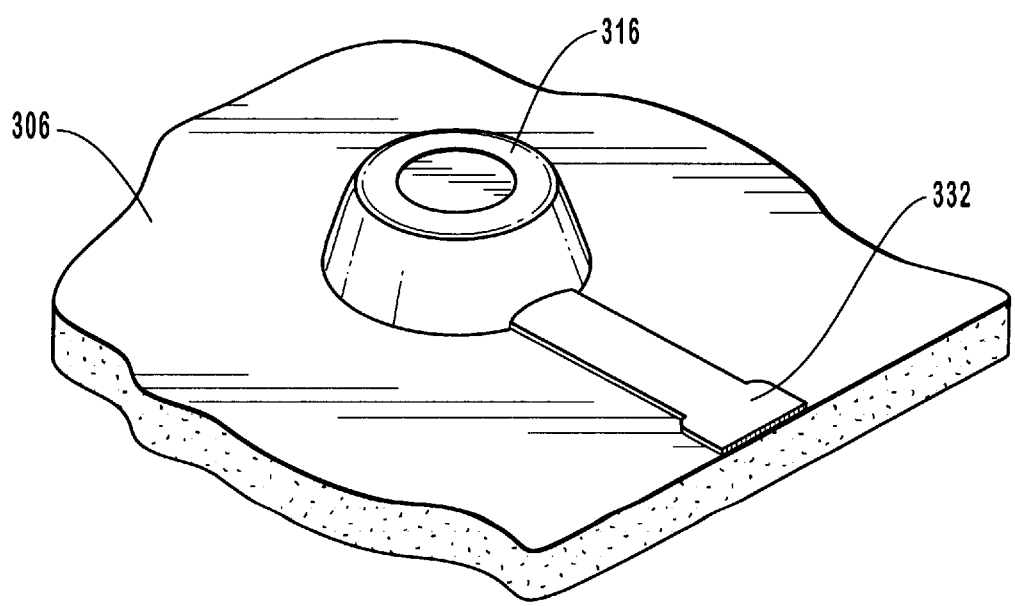
FIG. 19 is a perspective view of the socket assembly of FIG. 17.
Figure 20:
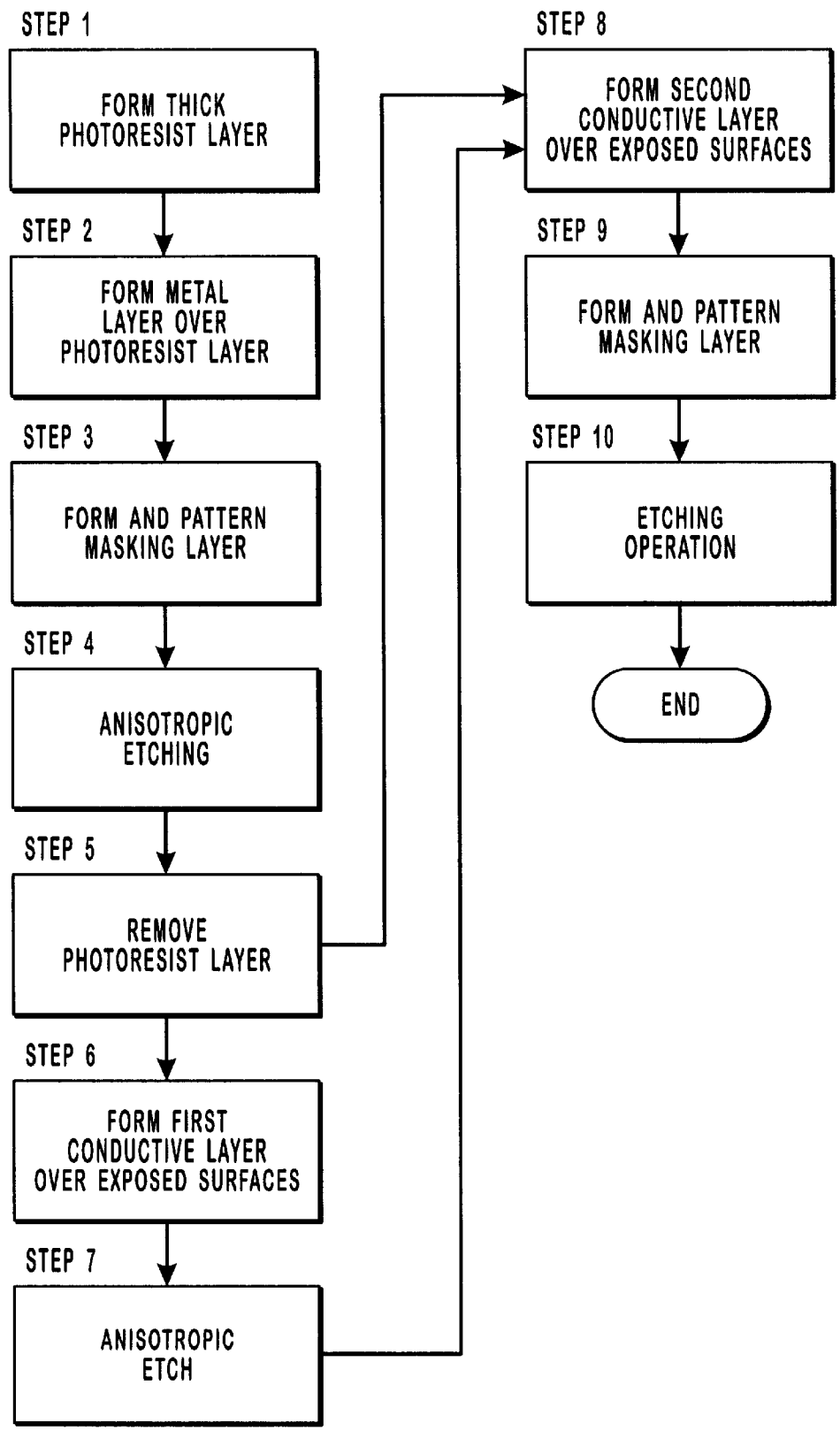
FIG. 20 is a flow chart that depicts the steps in the process of forming the socket assembly of FIG. 19.

FIG. 18 depicts the socket assembly formed according to the third embodiment of the invention, including socket 314, ball contact structure 316, and electrical trace 332 and further illustrates the cross sectional plane that is seen in FIG. 17. Again, depending on the nature of the conductive surfaces of the socket assembly, one or more conductive films may be advantageously formed thereover as described above in reference to the first and second embodiments. FIG. 19 is a perspective view of the socket assembly of FIG. 18. It can be seen that electrical trace 332 has a thickness that is significantly less than a thickness of ball contact structure 316. FIG. 20 is a flow chart that depicts preferred steps of the process of forming the socket assembly of FIG. 18.

The second and third embodiments of the invention provide the advantage that a socket assembly is formed over a substrate wherein a ball contact structure of the socket assembly has a sufficient thickness such that a clearance is maintained between a solder ball and the substrate. The thickness of the ball contact structure is made possible by the use of a relatively thick photoresist layer. In addition, the methods of the second and third embodiment provide the additional advantage that an electroplated metal layer does not form the entire thickness of the ball contact structure. This is significant because in many instances electroplating can be a relatively slow yet valuable process for depositing a metal layer. However, in some cases, for economic considerations, it may be most efficient to limit the depth to which an electroplated metal layer is formed. This is accomplished in the second and third embodiments by utilizing a relatively thick layer of photoresist as a permanent component of the ball contact structure.

Figure 21:
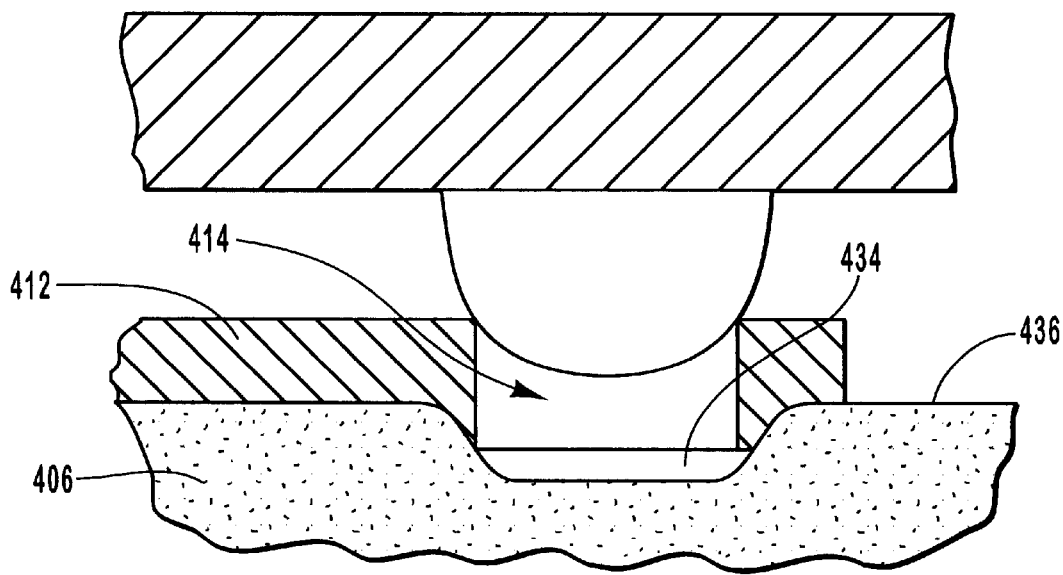
FIG. 21 is a cross-sectional elevation view of a solder ball inserted into a socket assembly having been formed according to a fourth embodiment of the invention, wherein a depression is formed into the surface of the substrate before overlying layers are formed thereon.

Another technique for limiting the depth to which an electroplated layer is formed is seen in FIG. 21 in relation to a fourth embodiment of the invention. In particular, the method of this embodiment begins by forming a depression 434 in surface 436 of substrate 406. The depression may be formed by conventional methods. For example, if substrate 406 consists essentially of a silicon material, an etching operation may be used to form depression 434. Thereafter, a socket assembly is formed on surface 436 such that socket 414 is substantially vertically aligned with depression 434. The socket assembly is preferably formed using the first embodiment of the invention, which is taught herein in reference to FIGS. 6A–9. The depth to which the photoresist layer and the associated conductive layer 412 are formed may be reduced by an amount essentially equal to the depth of depression 434.

It will be understood that depression 434 contributes an adequate aspect ratio of socket 414. Alternatively, the socket assembly may be formed over surface 436 according to the methods described herein relating to the second or third embodiments which are described in reference to FIG. 10–13 and FIGS. 14–20, respectively. However, using the methods according to the second or third embodiments of the invention with the structure of FIG. 21 is not as preferred. In particular, the second and third embodiments already include steps that allow reduction of the thickness of the metal layer, and using such methods with the structure of FIG. 21 may lead to some duplication of effort.

Figure 22:
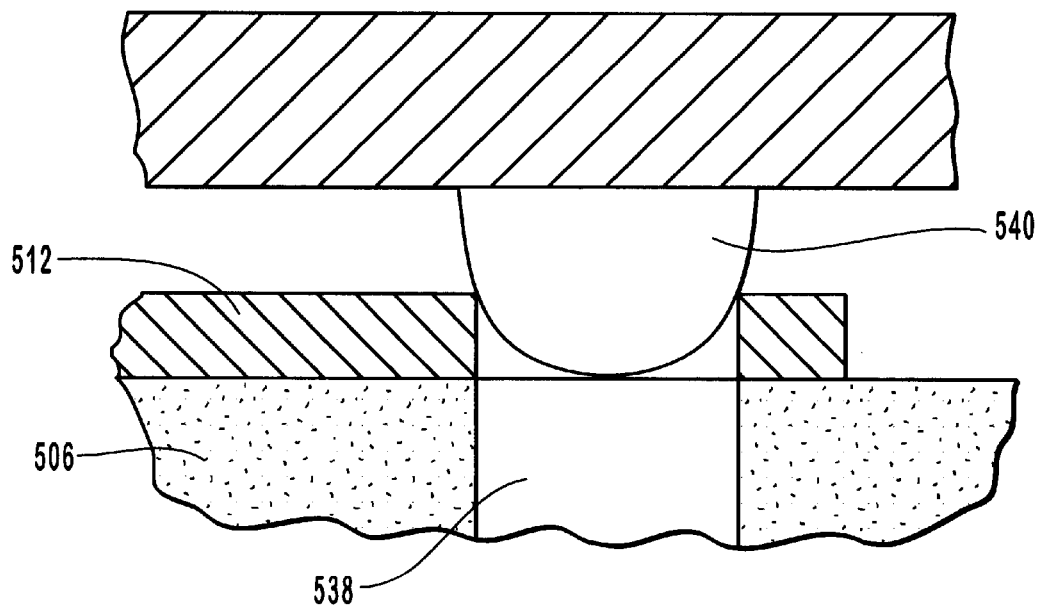
FIG. 22 is a cross-sectional elevation view of a solder ball inserted into a socket assembly having been formed according to a fifth embodiment of the invention, wherein an aperture is formed through the substrate before overlying layers are formed thereon.

Similarly, FIG. 22 depicts a socket assembly having been constructed according to a fifth embodiment of the invention. The first step of the method involves forming an aperture 538 through substrate 506. Aperture 538 may be formed by methods known in the art. For example, if substrate 506 consists essentially of a ceramic material, the formation of aperture 538 may involve a drilling, punching, or laser ablation operation. Aperture 538 ensures that solder ball 540 does not make contact with substrate 506. The socket assembly may be constructed over substrate 506 according to any of the first, second, and third embodiments, while the first embodiment is most preferred. The thickness of conductive layer 512 may be reduced because clearance between solder ball 540 and substrate 506 is substantially ensured by the presence of aperture 538.

Alternatively, the inner surface of aperture 538 may be plated with a conductive material in order to provide a conductive path to external circuitry. In this case, the socket assembly may be used without the electrical trace extending over the surface of substrate 506. Instead, the plated conductive material within aperture 538 may be used to provide electrical connection between solder ball 540 and external circuitry.

In an electroplating operations, it may be desirable to buss all traces together. If this is done is a wafer form, it can be done by running a relatively small and narrow trace into the dice street and that is connected to a common buss trace in the street that busses all traces together. Then, electroplating then makes one or more contacts to the buss trace. After fabrication processing when the wafer is diced, the dicing saw will cut off the buss bars, leaving discreet signal lines. Alternatively, if left in wafer form, there can be a partial dicing or scribing of through streets to as to sever the buss bar connections.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for forming a conductive structure over a substrate, said method comprising:

forming a photoresist layer over said substrate, said photoresist layer being formed with a thickness in a range from about 20 microns to about 450 microns;

forming a patterned opening in said photoresist layer and extending through said photoresist layer;

forming a conductive layer within said patterned opening; and removing a portion of said photoresist layer in contact with said conductive layer, thereby forming a socket at least partially surrounded laterally by said conductive layer, said socket being adapted to receive a solder ball of a semiconductor structure.

2. A method as defined in claim 1, further comprising, prior to forming said photoresist layer, forming a seed metal layer on said substrate.

3. A method as defined in claim 2, wherein forming said seed metal layer comprises:

sputter depositing a layer of a metal material onto said substrate; and patterning said layer of said metal material by selectively removing a portion of said layer of said metal material.

4. A method as defined in claim 2, wherein forming said patterned opening in said photoresist layer is conducted such that said seed metal layer is exposed therethrough.

5. A method as defined in claim 1, wherein forming said conductive layer comprises conducting an electroplating operation.

6. A method as defined in claim 1, wherein removing a portion of said photoresist layer comprises stripping substantially all of said photoresist layer that remains over said substrate after said patterned opening is formed.

7. A method as defined in claim 1, wherein said conductive layer is formed to a thickness in a range from about 20 microns to about 450 microns.

8. A method as defined in claim 1, wherein said conductive layer is substantially composed of a first metal, and wherein said method further includes, after forming said conductive layer, electroplating a layer of a second metal onto a surface of said conductive layer, said second metal being different from said first metal.

9. A method as defined in claim 8, said method further comprising, after electroplating said layer of said second metal, electroplating a layer of a third metal onto said layer of said second metal, said third metal being different from said first metal and from said second metal.

10. A method as defined in claim 1, wherein forming said photoresist layer comprises applying a photoresist material over said substrate, wherein said photoresist material includes:

a cationic photoinitiator capable of producing cations in response to electromagnetic radiation;

a polyepoxyfunctional novalac resin which is curable in response to said cations produced by said cationic photoinitiator; and an organic diluent in which said resin is at least partially dissolved.

11. A method for forming a conductive structure over a substrate, said method comprising:

forming a photoresist layer over said substrate, said photoresist layer including:

a cationic photoinitiator capable of producing cations in response to electromagnetic radiation;

a polyepoxyfunctional novalac resin which is curable in response to said cations produced by said cationic photoinitiator; and an organic diluent in which said resin is at least partially dissolved;

forming a patterned opening in said photoresist layer and extending through said photoresist layer;

forming a conductive layer within said patterned opening; and removing a portion of said photoresist layer in contact with said conductive layer, thereby forming a socket at least partially surrounded laterally by said conductive layer, said socket being adapted to receive a solder ball of a semiconductor structure.

12. A method for forming a conductive structure over a substrate, said method comprising:

forming a first photoresist layer over said substrate;

forming a conductive layer over said first photoresist layer;

forming a second photoresist layer on said conductive layer;

forming a first patterned opening in said second photoresist layer so as to expose a region of said conductive layer;

forming a second patterned opening in said conductive layer by removing a portion of said conductive layer through said first patterned opening, a region of said first photoresist layer being exposed; and removing a portion of said first photoresist layer through said second patterned opening.

13. A method as defined in claim 12, wherein said first photoresist layer is formed to a thickness in a range from about 20 microns to about 450 microns.

14. A method as defined in claim 12, wherein forming said second patterned opening comprises conducting an etching operation on said conductive layer through said first patterned opening.

15. A method as defined in claim 12, wherein forming said first patterned opening in said second photoresist layer includes forming a patterned masking structure from said second photoresist layer, and wherein said patterned masking structure is substantially removed simultaneously with removing said portion of said first photoresist layer.

16. A method as defined in claim 12, wherein forming said second patterned opening in said conductive layer and removing said portion of said first photoresist layer are conducted such that a conductive ball contact structure is formed from said conductive layer and said first photoresist layer after removing said portion of said first photoresist layer, said ball contact structure being adapted for receiving a solder ball of a semiconductor structure.

17. A method for forming a conductive structure over a substrate, said method comprising:

forming a multilayer structure over a substrate, said multilayer structure including a lower photoresist layer over said substrate and an upper conductive layer over said lower photoresist layer, said multilayer structure having a top surface and a sidewall;

forming a conformal conductive layer over said multilayer structure and over said substrate, a first portion of said conformal conductive layer being disposed on said sidewall;

etching said conformal conductive layer, whereby a second portion of said conformal conductive layer is removed while said first portion of said conformal conductive layer remains disposed on said sidewall; and forming an electrical trace on said substrate, said electrical trace being electrically connected to said first portion of said conformal conductive layer that remains disposed on said sidewall.

18. A method as defined in claim 17, wherein forming said multilayer structure comprises:

forming said lower photoresist layer over said substrate, said lower photoresist layer having a thickness in a range from about 20 microns to about 450 microns;

forming said upper conductive layer over said lower photoresist layer;

forming an upper photoresist layer on said upper conductive layer;

forming a first patterned opening in said upper photoresist layer so as to expose a region of said conductive layer;

forming a second patterned opening in said conductive layer by removing a portion of said conductive layer through said first patterned opening, a region of said lower photoresist layer being exposed; and removing a portion of said lower photoresist layer through said second patterned opening, whereby a region of said substrate is exposed.

19. A method as defined in claim 18, wherein forming said second patterned opening in said upper conductive layer and removing said portion of said lower photoresist layer are conducted such that a conductive ball contact structure is formed from said upper conductive layer and said lower photoresist layer after removing said portion of said lower photoresist layer, said ball contact structure being adapted for receiving a solder ball of a semiconductor structure.

20. A method as defined in claim 17, wherein forming said electrical trace comprises:

forming a metal film disposed over said substrate, said multilayer structure, and said first portion of said conformal conductive layer;

selectively forming a masking photoresist layer over said metal film such that a first portion of said metal film is covered and a second portion of said metal film remains uncovered; and etching said metal film, whereby said second portion of said metal film is substantially removed and said first portion of said metal film remains substantially disposed over said substrate.

21. A method as defined in claim 20, wherein forming said metal film comprises sputter depositing a metal material.

22. A method as defined in claim 17, wherein forming said conformal conductive layer comprises sputter depositing a metal material.

23. A method for forming a conductive structure over a substrate, said method comprising:

forming an aperture in said substrate, said aperture extending from a surface of said substrate through said substrate;

forming a photoresist layer over said surface of said substrate, said photoresist layer having a thickness of at least about 20 microns;

forming a patterned opening in and extending through said photoresist layer, a portion of said patterned opening being positioned laterally adjacent said aperture; and forming a conductive layer in said patterned opening and laterally adjacent said aperture.

24. A method as defined in claim 23, wherein forming said conductive layer comprises conducting an electroplating operation.

25. A method as defined in claim 23, wherein forming said aperture in said substrate comprises conducting an operation selected from the group consisting of punching, drilling, and laser ablation.

26. A method as defined in claim 23, wherein forming said conductive layer in said patterned opening is conducted such that a socket is defined by said conductive layer, said socket being adapted to receive a solder ball of a semiconductor structure, said socket being substantially vertically aligned with said aperture such that said aperture may be accessed through said socket.

27. A method as defined in claim 23, further comprising, after forming said aperture in said substrate, plating an inner surface of said aperture with a conductive material.

28. A method for forming a ball contact structure for receiving a solder ball of a ball grid array, said method comprising:

forming a layer of a photoresist material upon a substrate;

providing an exposed conductive layer over the layer of the photoresist material;

forming a recess in the exposed conductive layer and the layer of the photoresist material that is configured to receive a solder ball of a ball grid array; and forming an electrical trace extending from the exposed conductive layer.

29. The method as defined in claim 28, wherein forming a layer of a photoresist material upon a substrate comprises forming the photoresist material in a thickness in a range from about 20 microns to about 450 microns.

30. The method as defined in claim 28, wherein:

said electrical trace has a thickness that is substantially equal to the combined thickness of the layer of the photoresist material and the exposed conductive layer; and forming an electrical trace extending from the exposed conductive layer comprises forming said electrical trace to extend from said exposed conductive layer to a terminal contact pad.

31. The method as defined in claim 28, wherein forming a layer of a photoresist material upon a substrate comprises creating said photoresist material from the reaction products of:

a cationic photoinitiator capable of producing cations in response to electromagnetic radiation;

a polyepoxyfunctional novalac resin which is curable in response to said cations produced by said cationic photoinitiator; and an organic diluent in which said resin is at least partially dissolved.

32. The method as defined in claim 28, wherein the recess has an aspect ratio greater than about 1:2.

33. The method as defined in claim 28, wherein:

forming a layer of a photoresist material upon a substrate comprises:

forming said photoresist material to have an outer sidewall, an inner sidewall, a base disposed on said substrate, and a top surface opposite said base, a portion of said ball contact structure being positioned laterally adjacent to said aperture, said ball contact structure including an exposed conductive layer;

forming a recess in the exposed conductive layer and the layer of the photoresist material that is configured to receive a solder ball of a ball grid array comprises:

forming a lateral wall defined by said inner sidewall such that the recess is at least partially surrounded laterally by said inner sidewall.

* * * * *

UNITED STATES PATENT AND TRADEMARK OFFICE
CERTIFICATE OF CORRECTION

PATENT NO. : 6,562,545 B1
DATED : May 13, 2003
INVENTOR(S) : Hembree et al.

It is certified that error appears in the above-identified patent and that said Letters Patent is hereby corrected as shown below:

Title page,
Item [56], References Cited, U.S. PATENT DOCUMENTS, after "6,207,354 B1" change "3/2000" to -- 3/2001 --

Column 1,
Line 23, before "preselected" insert -- a --
Line 29, change "structure" to -- structures --
Line 39, change "environment al" to -- environmental --

Column 6,
Line 44, "perspective" change "is a is a" to -- is a --

Column 8,
Line 37, change "hall" to -- ball --

Column 9,
Line 40, after "defined" delete "a"

Column 12,
Line 5, change "is" to -- it --
Line 40, change "examples" to -- example --

Column 16,
Line 41, change "is" to -- in --

Signed and Sealed this

Fifteenth Day of February, 2005

JON W. DUDAS
*Director of the United States Patent and Trademark Office*